US012684683B2

(12) United States Patent
Fujimori

(10) Patent No.: US 12,684,683 B2
(45) Date of Patent: Jul. 14, 2026

(54) RADIO FREQUENCY MODULE, COMMUNICATION DEVICE, AND FILTER

(71) Applicant: Murata Manufacturing Co., Ltd., Nagaokakyo (JP)

(72) Inventor: Eiji Fujimori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 209 days.

(21) Appl. No.: 18/789,807

(22) Filed: Jul. 31, 2024

(65) Prior Publication Data

US 2024/0389222 A1 Nov. 21, 2024

Related U.S. Application Data

(63) Continuation of application No. PCT/JP2023/014386, filed on Apr. 7, 2023.

(30) Foreign Application Priority Data

Apr. 12, 2022 (JP) ................................. 2022-065870

(51) Int. Cl.
H05K 1/02 (2006.01)
H03H 9/145 (2006.01)
(Continued)

(52) U.S. Cl.
CPC ........... *H05K 1/0243* (2013.01); *H03H 9/568* (2013.01); *H05K 1/115* (2013.01); *H05K 2201/1006* (2013.01)

(58) Field of Classification Search
CPC ................. H05K 1/0243; H05K 1/115; H05K 2201/1006
See application file for complete search history.

(56) References Cited

U.S. PATENT DOCUMENTS

2007/0170565 A1* 7/2007 Hong ................... H03H 9/0547
257/678
2009/0224851 A1 9/2009 Feiertag et al.
(Continued)

FOREIGN PATENT DOCUMENTS

CN 111600565 A 8/2020
JP 2007067617 A 3/2007
(Continued)

OTHER PUBLICATIONS

International Search Report in PCT/JP2023/014386, mailed Jun. 20, 2023, 3 pages.
(Continued)

*Primary Examiner* — Timothy J Thompson
*Assistant Examiner* — Amol H Patel
(74) *Attorney, Agent, or Firm* — Keating & Bennett, LLP

(57) ABSTRACT

In a filter of a radio frequency module, a first chip is provided on a mounting board, and a second chip is provided on the first chip. The first and second chips respectively include first and second resonators. The first and second resonators face each other in a thickness direction of the mounting board. The first chip includes first and second through-via conductors, and first and second wiring portions. The first through-via conductor is interposed between a first terminal and a first connection conductor portion. A distance between the second through-via conductor and the first through-via conductor is shorter than a distance between the first wiring portion and the first through-via conductor.

20 Claims, 22 Drawing Sheets

(51) Int. Cl.

| | | |
|---|---|---|
| *H03H 9/25* | (2006.01) | |
| *H03H 9/56* | (2006.01) | |
| *H03H 9/64* | (2006.01) | |
| *H03H 9/72* | (2006.01) | |
| *H04B 1/38* | (2015.01) | |
| *H05K 1/11* | (2006.01) | |

(56)        References Cited

U.S. PATENT DOCUMENTS

| | | | |
|---|---|---|---|
| 2017/0250669 A1 | 8/2017 | Kuroyanagi et al. | |
| 2022/0345112 A1* | 10/2022 | Ito | H03H 9/02574 |
| 2023/0291386 A1* | 9/2023 | Oba | H03H 9/205 |
| 2023/0308080 A1* | 9/2023 | Hatano | H03H 9/568 |
| 2024/0250435 A1* | 7/2024 | Fujiwara | H03H 9/6483 |

FOREIGN PATENT DOCUMENTS

| | | | |
|---|---|---|---|
| JP | 2007202130 A | 8/2007 | |
| JP | 2008546207 A | 12/2008 | |
| JP | 2017157922 A | 9/2017 | |
| JP | 2020043442 A | 3/2020 | |
| WO | 2021060444 A1 | 4/2021 | |

OTHER PUBLICATIONS

Written Opinion in PCT/JP2023/014386, mailed Jun. 20, 2023, 3 pages.

* cited by examiner

RADIO FREQUENCY MODULE, COMMUNICATION DEVICE, AND FILTER

CROSS REFERENCE TO RELATED APPLICATIONS

This application claims the benefit of priority to Japanese Patent Application No. 2022-065870 filed on Apr. 12, 2022 and is a Continuation Application of PCT Application No. PCT/JP2023/014386 filed on Apr. 7, 2023. The entire contents of each application are hereby incorporated herein by reference.

BACKGROUND OF THE INVENTION

1. Field of the Invention

The present invention generally relates to radio frequency modules, communication devices, and filters, and more particularly relates to radio frequency modules including filters, communication devices including radio frequency modules, and filters.

2. Description of the Related Art

Chinese Unexamined Patent Application Publication No. 111600565 discloses a filter circuit including a series resonator, a first wafer at which the series resonator is disposed, a parallel resonator connected between the series resonator and a ground, a second wafer at which the parallel resonator is disposed, a plurality of solder balls that connect the second wafer to a board (mounting board), and a plurality of wafer vias that are disposed in the second wafer and are connected to the plurality of solder balls.

One of the wafer vias disposed on both sides of the second wafer is connected to an input terminal, and the other is connected to an output terminal.

In a radio frequency module in the related art, the characteristics of a filter may be deteriorated due to an occurrence of inductive coupling between a path between a mounting board and a series arm resonator of the filter and a path between a parallel arm resonator of the filter and the mounting board, for example.

SUMMARY OF THE INVENTION

Example embodiments of the present invention provide radio frequency modules, communication devices, and filters each able to reduce or prevent a deterioration in characteristics of a filter.

According to an example embodiment of the present invention, a radio frequency module includes a mounting board and a filter. The mounting board includes a first conductor portion, a second conductor portion, and a ground conductor portion. The filter is provided on the mounting board. The filter includes a first input/output terminal, a second input/output terminal, a ground terminal, a series arm resonator, and a parallel arm resonator. The first input/output terminal, the second input/output terminal, and the ground terminal are connected to the first conductor portion, the second conductor portion, and the ground conductor portion, respectively. The series arm resonator is provided in a signal path between the first input/output terminal and the second input/output terminal and is closest to the first input/output terminal or the second input/output terminal. The parallel arm resonator is connected between the signal path and the ground conductor portion and is closest to the series arm resonator. In the filter, a first chip is provided on the mounting board, and a second chip is provided on the first chip. The first chip includes a first resonator defined by one of the series arm resonator and the parallel arm resonator. The second chip includes a second resonator defined by a remaining one of the series arm resonator and the parallel arm resonator. In the filter, the first resonator and the second resonator face each other in a thickness direction of the mounting board. The filter includes a first connection conductor portion and a second connection conductor portion. The first connection conductor portion and the second connection conductor portion are interposed between the first chip and the second chip in the thickness direction of the mounting board. The first chip includes a first through-via conductor, a second through-via conductor, a first wiring portion, and a second wiring portion. The first through-via conductor is interposed between a first terminal and the first connection conductor portion. The first terminal is one of the ground terminal and an input/output terminal closest to the series arm resonator among the first input/output terminal and the second input/output terminal. The second through-via conductor is connected to a second terminal. The second terminal is a remaining one of the ground terminal and the input/output terminal closest to the series arm resonator among the first input/output terminal and the second input/output terminal. The first wiring portion connects the second connection conductor portion and the first resonator to each other. The second wiring portion connects the first resonator and the second through-via conductor to each other. The second chip includes a third wiring portion and a fourth wiring portion. The third wiring portion connects the first connection conductor portion and the second resonator to each other. The fourth wiring portion connects the second resonator and the second connection conductor portion to each other. A distance between the second through-via conductor and the first through-via conductor is shorter than a distance between the first wiring portion and the first through-via conductor.

According to an example embodiment of the present invention, a radio frequency module includes a mounting board and a filter. The mounting board includes a first conductor portion, a second conductor portion, and a ground conductor portion. The filter is provided on the mounting board. The filter includes a first input/output terminal, a second input/output terminal, a ground terminal, a series arm resonator, and a parallel arm resonator. The first input/output terminal, the second input/output terminal, and the ground terminal are connected to the first conductor portion, the second conductor portion, and the ground conductor portion, respectively. The series arm resonator is provided in a signal path between the first input/output terminal and the second input/output terminal and is closest to the first input/output terminal or the second input/output terminal. The parallel arm resonator is connected between the signal path and the ground conductor portion and is closest to the series arm resonator. In the filter, a first chip is provided on the mounting board, and a second chip is provided on the first chip. The first chip includes a first resonator defined by one of the series arm resonator and the parallel arm resonator. The second chip includes a second resonator defined by a remaining one of the series arm resonator and the parallel arm resonator. In the filter, the first resonator and the second resonator face each other in a thickness direction of the mounting board. The filter includes a first connection conductor portion and a second connection conductor portion. The first connection conductor portion and the second connection conductor portion are interposed between the first chip and the second chip in the thickness direction of the mounting board. The first chip includes a first through-via conductor, a second through-via conductor, a first wiring portion, and a second wiring portion. The first through-via conductor is interposed between a first terminal and the first connection conductor portion. The first terminal is one of the ground terminal and an input/output terminal closest to the series arm resonator among the first input/output terminal and the second input/output terminal. The second through-via conductor is connected to a second terminal. The second terminal is a remaining one of the ground terminal and the input/output terminal closest to the series arm resonator among the first input/output terminal and the second input/output terminal. The first wiring portion connects the second connection conductor portion and the first resonator to each other. The second wiring portion connects the first resonator and the second through-via conductor to each other. The second chip includes a third wiring portion and a fourth wiring portion. The third wiring portion connects the first connection conductor portion and the second resonator to each other. The fourth wiring portion connects the second resonator and the second connection conductor portion to each other. In plan view in the thickness direction of the mounting board, a direction of a radio frequency signal passing through the first resonator is opposite to a direction of a radio frequency signal passing through the second resonator.

According to an example embodiment of the present invention, a communication device includes a radio frequency module according to an example embodiment of the present invention and a signal processing circuit. The signal processing circuit is connected to the radio frequency module.

According to an example embodiment of the present invention, a filter is provided on a mounting board. The filter includes a first input/output terminal, a second input/output terminal, a ground terminal, a series arm resonator, and a parallel arm resonator. The first input/output terminal, the second input/output terminal, and the ground terminal are connected to the first conductor portion, the second conductor portion, and the ground conductor portion provided in the mounting board, respectively. The series arm resonator is provided in a signal path between the first input/output terminal and the second input/output terminal and is closest to the first input/output terminal or the second input/output terminal. The parallel arm resonator is connected between the signal path and the ground conductor portion and is closest to the series arm resonator. In the filter, a first chip and a second chip are stacked. The first chip includes a first resonator defined by one of the series arm resonator and the parallel arm resonator. The second chip includes a second resonator defined by a remaining one of the series arm resonator and the parallel arm resonator. In the filter, the first resonator and the second resonator face each other in a thickness direction of the first chip. The filter includes a first connection conductor portion and a second connection conductor portion. The first connection conductor portion and the second connection conductor portion are interposed between the first chip and the second chip in the thickness direction of the first chip. The first chip includes a first through-via conductor, a second through-via conductor, a first wiring portion, and a second wiring portion. The first through-via conductor is interposed between a first terminal and the first connection conductor portion. The first terminal is one of the ground terminal and an input/output terminal closest to the series arm resonator among the first input/output terminal and the second input/output terminal. The second through-via conductor is connected to a second terminal. The second terminal is a remaining one of the ground terminal and the input/output terminal closest to the series arm resonator among the first input/output terminal and the second input/output terminal. The first wiring portion connects the second connection conductor portion and the first resonator to each other. The second wiring portion connects the first resonator and the second through-via conductor to each other. The second chip includes a third wiring portion and a fourth wiring portion. The third wiring portion connects the first connection conductor portion and the second resonator to each other. The fourth wiring portion connects the second resonator and the second connection conductor portion to each other. A distance between the second through-via conductor and the first through-via conductor is shorter than a distance between the first wiring portion and the first through-via conductor.

According to example embodiments of the present invention, radio frequency modules, communication devices, and filters are each able to reduce or prevent deterioration in characteristics of the filter.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
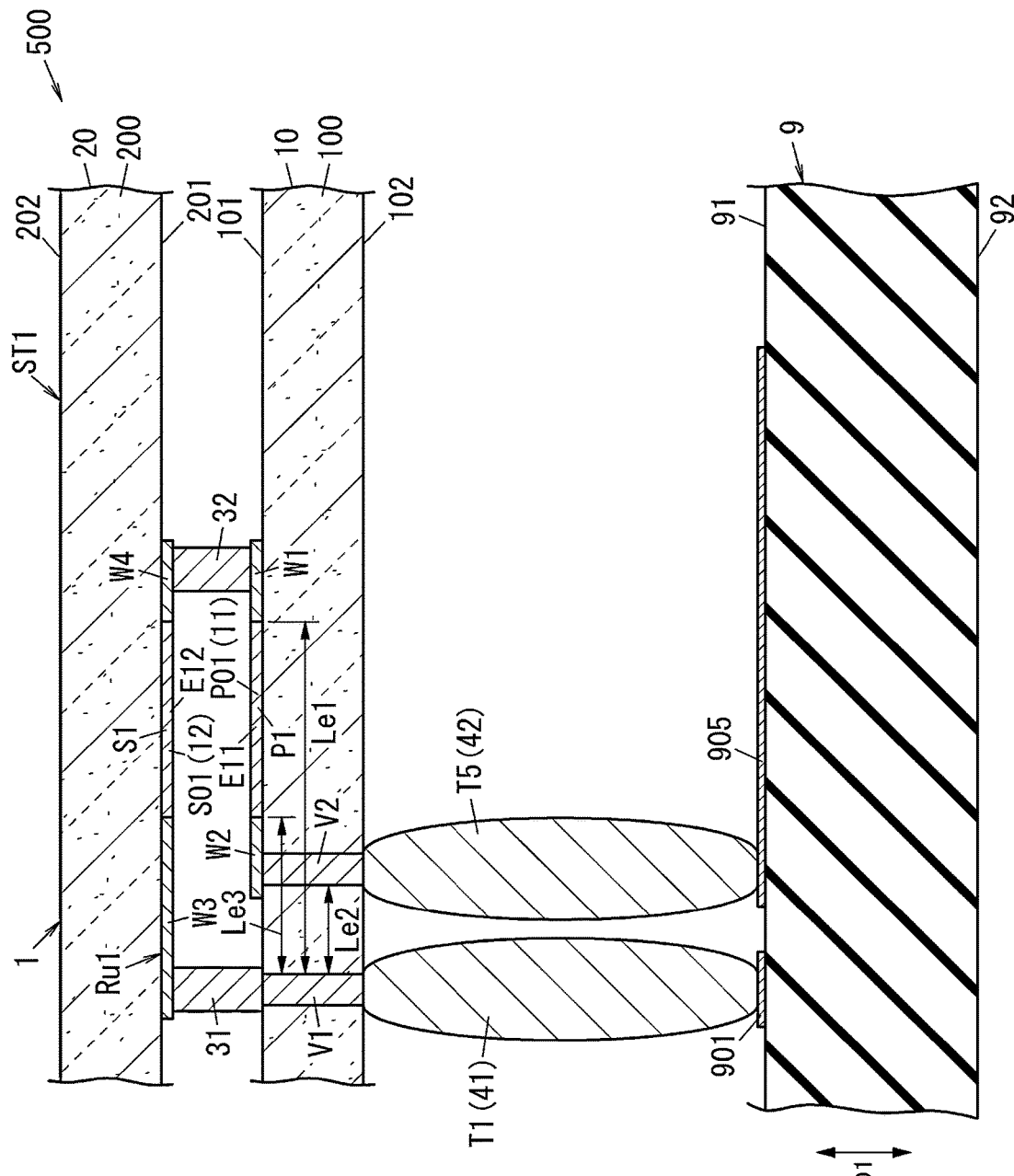
FIG. 1 is a cross-sectional view of a radio frequency module according to Example Embodiment 1 of the present invention.

The drawings referred to in the following description of Example Embodiments 1 to 3 and the like are all schematic drawings, and the ratios of the respective sizes and thicknesses of the elements in the drawings do not necessarily reflect the actual dimensional ratios.

Example Embodiment 1

A radio frequency module 500 and a communication device 600 according to Example Embodiment 1 of the present invention will be described below with reference to FIGS. 1 to 7.

(1) Outline

Figure 5:
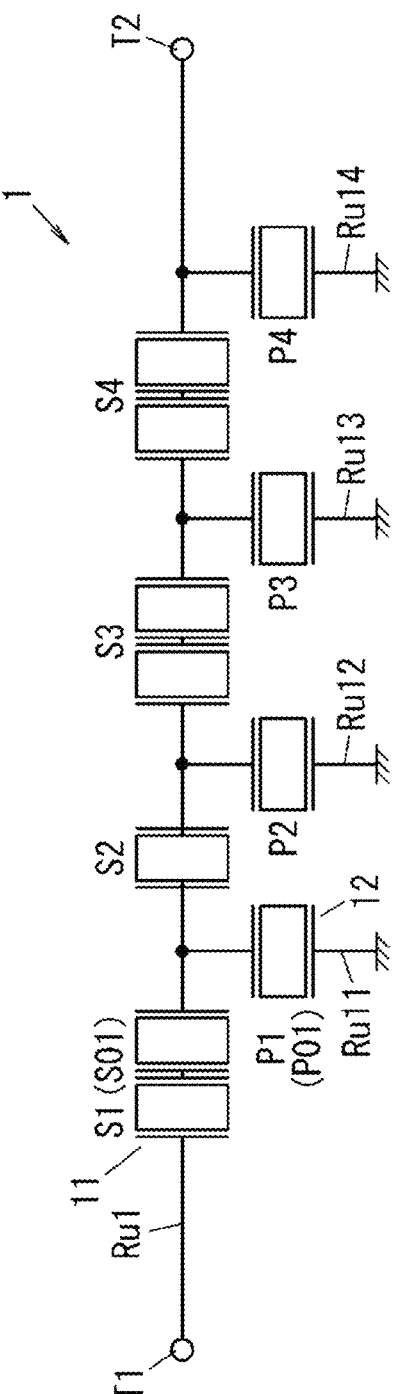
FIG. 5 is a circuit diagram of the filter in the radio frequency module according to Example Embodiment 1 of the present invention.
Figure 6:
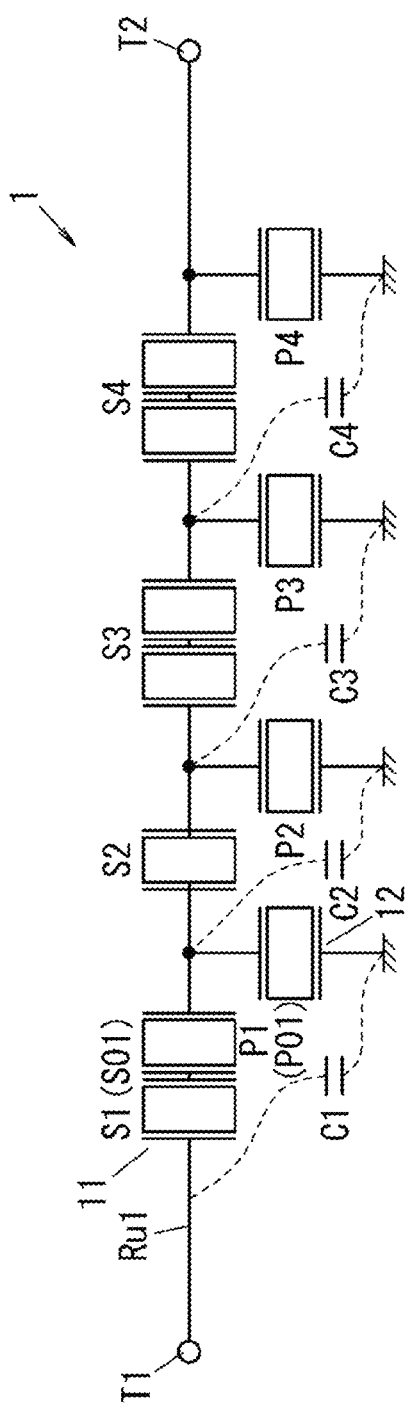
FIG. 6 is a circuit diagram of the filter in the radio frequency module according to Example Embodiment 1 of the present invention.

As shown in FIG. 1, the radio frequency module 500 according to Example Embodiment 1 includes a mounting board 9 and a filter 1. The filter 1 includes, for example, a plurality of (for example, eight) acoustic wave resonators. For example, as shown in FIG. 5, the plurality of acoustic wave resonators include four series arm resonators S1, S2, S3, and S4 and four parallel arm resonators P1, P2, P3, and P4. In the example of FIG. 5, each of the three series arm resonators S1, S3, and S4 among the four series arm resonators S1, S2, S3, and S4 is defined by a plurality (for example, two) of split resonators, but the present invention is not limited to this. The plurality of split resonators are resonators in which one acoustic wave resonator is split, and are connected in series without interposing another acoustic wave resonator between the split resonators and without interposing a connection node to a path including another acoustic wave resonator.

As shown in FIG. 1, the mounting board 9 includes a first conductor portion 901, a second conductor portion (not shown), and a ground conductor portion 905. The filter 1 is disposed on the mounting board 9. The filter 1 includes a first input/output terminal T1, a second input/output terminal T2 (see FIGS. 3A and 5), a ground terminal T5, a series arm resonator S01, and a parallel arm resonator P01. The first input/output terminal T1, the second input/output terminal T2, and the ground terminal T5 are connected to the first conductor portion 901, a second conductor portion (not shown), and the ground conductor portion 905, respectively. The series arm resonator S01 is provided in a signal path Ru1 (see FIG. 5) between the first input/output terminal T1 and the second input/output terminal T2, and is the series arm resonator S1 closest to the first input/output terminal T1 among the plurality of series arm resonators S1, S2, S3, and S4 (see FIG. 5). The parallel arm resonator P01 is connected between the signal path Ru1 and the ground conductor portion 905, and is the parallel arm resonator P1 closest to the series arm resonator S01 among the plurality of parallel arm resonators P1, P2, P3, and P4 (see FIG. 5). In the filter 1, a first chip 10 is disposed on the mounting board 9, and a second chip 20 is disposed on the first chip 10. The first chip 10 includes a first resonator 11 that is one of the series arm resonator S01 and the parallel arm resonator P01. The second chip 20 includes a second resonator 12 that is the remaining one of the series arm resonator S01 and the parallel arm resonator P01. In the filter 1, the first resonator 11 and the second resonator 12 face each other in a thickness direction D1 of the mounting board 9. The filter 1 includes a first connection conductor portion 31 and a second connection conductor portion 32. The first connection conductor portion 31 and the second connection conductor portion 32 are interposed between the first chip 10 and the second chip 20 in the thickness direction D1 of the mounting board 9. The first chip 10 includes a first through-via conductor V1, a second through-via conductor V2, a first wiring portion W1, and a second wiring portion W2. The first through-via conductor V1 is interposed between a first terminal 41 and the first connection conductor portion 31 in the thickness direction D1 of the mounting board 9. The first through-via conductor V1 and the first terminal 41 only need to be electrically connected to each other in the first chip 10, and do not necessarily overlap each other in the thickness direction D1 of the mounting board 9. The first terminal 41 is the first input/output terminal T1. The second through-via conductor V2 overlaps a second terminal 42 in the thickness direction D1 of the mounting board 9. The second through-via conductor V2 only needs to be electrically connected to the second terminal 42 in the first chip 10, and do not necessarily overlap the second terminal 42 in the thickness direction D1 of the mounting board 9. The second terminal 42 is the ground terminal T5. The first wiring portion W1 connects the second connection conductor portion 32 and the first resonator 11 to each other. The second wiring portion W2 connects the first resonator 11 and the second through-via conductor V2 to each other. The second chip 20 includes a third wiring portion W3 and a fourth wiring portion W4. The third wiring portion W3 connects the first connection conductor portion 31 and the second resonator 12 to each other. The fourth wiring portion W4 connects the second resonator 12 and the second connection conductor portion 32 to each other. A distance Le2 between the second through-via conductor V2 and the first through-via conductor V1 is shorter than a distance Le1 between the first wiring portion W1 and the first through-via conductor V1.

Figure 2:
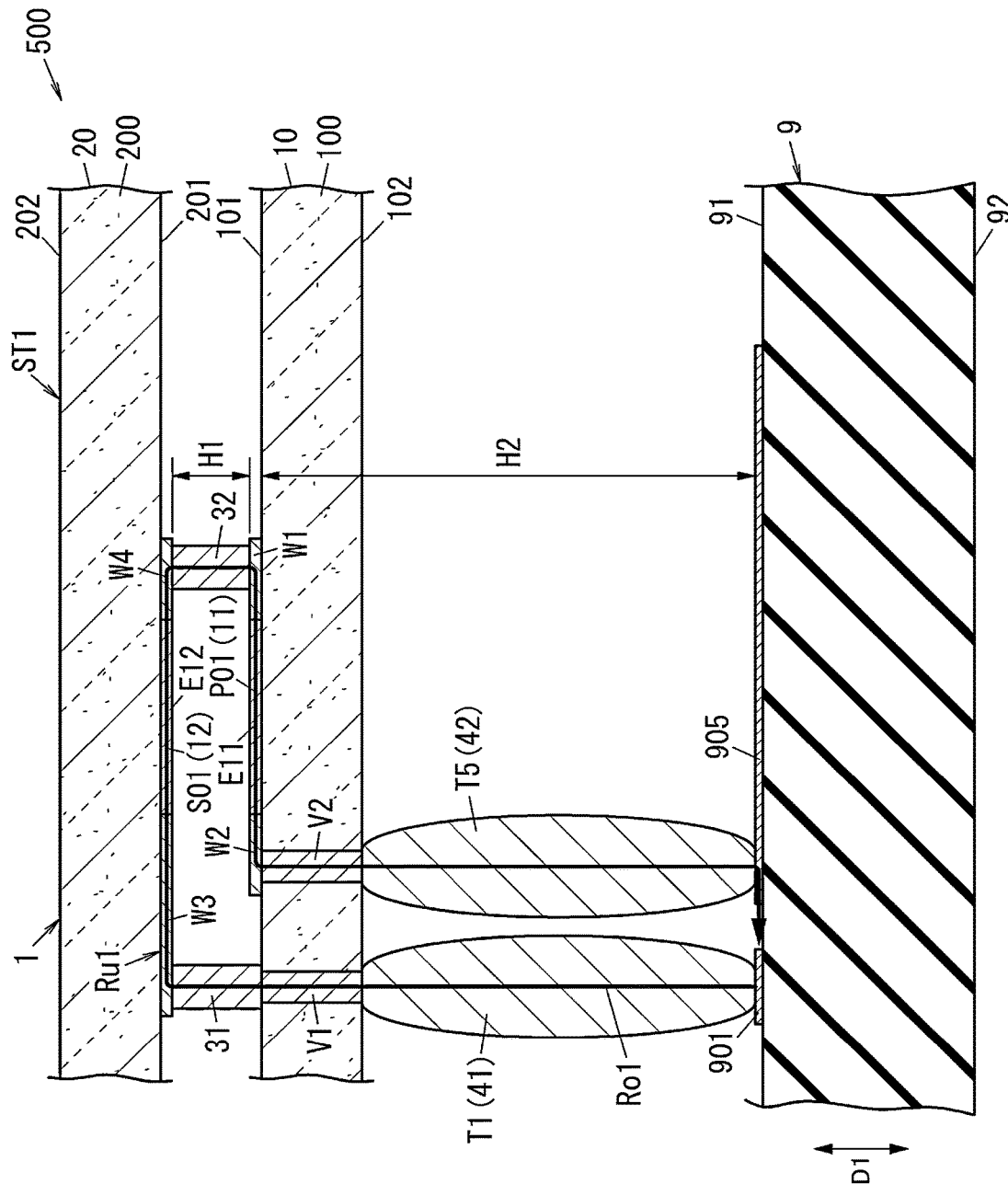
FIG. 2 is an explanatory diagram of a current loop path in the radio frequency module according to Example Embodiment 1 of the present invention.

In the radio frequency module 500, a current loop path Ro1 indicated by a thick arrow in FIG. 2 is provided. The current loop path Ro1 includes a path of the first conductor portion 901—the first terminal 41—the first through-via conductor V1—the first connection conductor portion 31—the third wiring portion W3—the second resonator 12—the fourth wiring portion W4—the second connection conductor portion 32—the first wiring portion W1—the first resonator 11—the second wiring portion W2—the second through-via conductor V2—the second terminal 42—the ground conductor portion 905. Here, the first conductor portion 901 is spaced away from the ground conductor portion 905, but, since there is a potential difference between the first conductor portion 901 and the ground conductor portion 905, a portion of the current loop path Ro1 includes a path of the ground conductor portion 905—the first conductor portion 901. In the radio frequency module 500, in the thickness direction D1 of the mounting board 9, a distance H2 between the second wiring portion W2 and the ground conductor portion 905 is longer than a distance H1 between the first wiring portion W1 and the fourth wiring portion W4.

Figure 7:
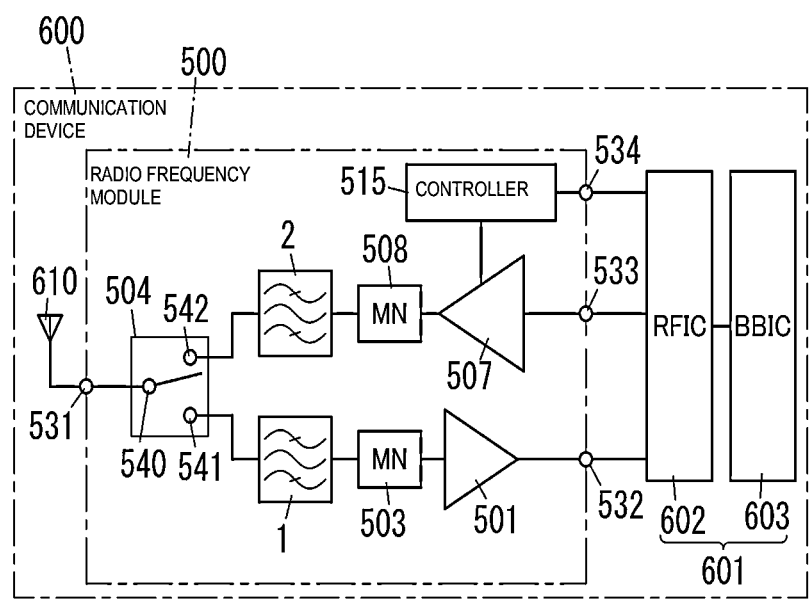
FIG. 7 is a circuit configuration diagram of a communication device including the radio frequency module according to Example Embodiment 1 of the present invention.

The radio frequency module 500 is used, for example, in the communication device 600 as shown in FIG. 7. The communication device 600 is, for example, a mobile phone (for example, a smartphone), but the present invention is not limited to this. The communication device 600 may be, for example, a wearable terminal (for example, a smartwatch). For example, the radio frequency module 500 is a module which can be compatible with the fourth generation mobile communication (4G) standard and the fifth generation mobile communication (5G) standard. For example, the 4G standard is the third generation partnership project (3GPP: registered trademark) long term evolution (LTE: registered trademark) standard. The 5G standard is, for example, the 5G new radio (NR).

The communication device 600 includes the radio frequency module 500 and a signal processing circuit 601. The communication device 600 further includes an antenna 610.

The communication device 600 further includes a circuit board (not shown) on which the radio frequency module 500 is mounted. The circuit board is, for example, a printed wiring board. The circuit board includes a ground electrode to which a ground potential is applied.

(2) Details

Circuit configurations of the radio frequency module 500 and the communication device 600 will be described below, and then a structure of the radio frequency module 500 will be described below in more detail.

(2.1) Circuit Configuration of Radio Frequency Module

The circuit configuration of the radio frequency module 500 according to Example Embodiment 1 will be described with reference to FIG. 7.

The radio frequency module 500 is configured, for example, to be able to amplify a reception signal input from the antenna 610 and output the amplified reception signal to the signal processing circuit 601. In addition, the radio frequency module 500 is configured to, for example, be able to amplify a transmission signal input from the signal processing circuit 601 and output the amplified transmission signal to the antenna 610. The signal processing circuit 601 is not an element of the radio frequency module 500, but an element of the communication device 600 including the radio frequency module 500. The radio frequency module 500 is controlled by, for example, the signal processing circuit 601 of the communication device 600.

As shown in FIG. 7, the radio frequency module 500 includes a filter 1 (also referred to as a first filter 1 below), a second filter 2, a low-noise amplifier 501, an input matching circuit 503, a power amplifier 507, an output matching circuit 508, a controller 515, and a switch 504. In the radio frequency module 500, for example, the first filter 1 defines a reception filter. In addition, in the radio frequency module 500, for example, the second filter 2 defines a transmission filter. Further, the radio frequency module 500 includes a plurality of external connection terminals. The plurality of external connection terminals include an antenna terminal 531, a signal output terminal 532, a signal input terminal 533, a plurality of control terminals 534 (FIG. 7 shows only one), and a plurality of external ground terminals (not shown). The plurality of external ground terminals are terminals to which the ground potential is applied.

The first filter 1 is, for example, a filter in which a reception band of a first communication band is used as a pass band. The first communication band is, for example, a communication band of the 3GPP LTE standard or a communication band of the 5G NR standard. The first communication band is, for example, Band25 of the 3GPP LTE standard or n25 of the 5G NR standard. The first communication band is a communication band used for communication compatible with frequency division duplex (FDD) as a communication method, but the present disclosure is not limited to this. The first communication band may be a communication band used for communication compatible with time division duplex (TDD).

The second filter 2 is, for example, a filter in which a transmission band of a second communication band is used as a pass band. The second communication band is, for example, Band25 of the 3GPP LTE standard or n25 of the 5G NR standard. The second communication band is a communication band used for communication compatible with FDD as a communication method, but the present disclosure is not limited to this. The second communication band may be a communication band used for communication compatible with TDD. In the radio frequency module 500 according to Example Embodiment 1, for example, the second communication band is the same communication band as the first communication band, and is Band 25 of the 3GPP LTE standard or n25 of the 5G NR standard, but may be a communication band different from the first communication band.

The low-noise amplifier 501 includes an input terminal and an output terminal. The low-noise amplifier 501 amplifies a reception signal input to the input terminal and outputs the amplified reception signal from the output terminal. The output terminal of the low-noise amplifier 501 is connected to the signal output terminal 532. The output terminal of the low-noise amplifier 501 is connected to the signal processing circuit 601 through, for example, the signal output terminal 532. The signal output terminal 532 is a terminal to output a radio frequency signal (reception signal) from the low-noise amplifier 501 to an external circuit (for example, the signal processing circuit 601).

The input matching circuit 503 is provided in a signal path between the first filter 1 and the input terminal of the low-noise amplifier 501. The input matching circuit 503 is a circuit to perform impedance matching between the first filter 1 and the low-noise amplifier 501, and includes, for example, one inductor. The input matching circuit 503 is not limited to a case including one inductor, and may include, for example, a plurality of inductors and a plurality of capacitors.

The power amplifier 507 includes an input terminal and an output terminal. The power amplifier 507 amplifies a transmission signal input to the input terminal and outputs the amplified transmission signal from the output terminal. The input terminal of the power amplifier 507 is connected to the signal input terminal 533. The input terminal of the power amplifier 507 is connected to the signal processing circuit 601 of the communication device 600 through the signal input terminal 533. The signal input terminal 533 is a terminal to input a radio frequency signal (transmission signal) from an external circuit (for example, the signal processing circuit 601) to the radio frequency module 500. The output terminal of the power amplifier 507 is connected to the switch 504 through the output matching circuit 508 and the second filter 2.

The output matching circuit 508 is provided in a signal path between the output terminal of the power amplifier 507 and the second filter 2. The output matching circuit 508 is a circuit to perform impedance matching between the power amplifier 507 and the second filter 2, and includes, for example, a plurality of inductors and a plurality of capacitors.

The controller 515 controls the power amplifier 507. The controller 515 controls the power amplifier 507 in accordance with, for example, a control signal from the signal processing circuit 601. The controller 515 is connected to the signal processing circuit 601 through a plurality of (for example, four) control terminals 534. The number of control terminals 534 is, for example, four, but FIG. 7 shows only one control terminal 534. The plurality of control terminals 534 are terminals to input control signals from an external circuit (for example, the signal processing circuit 601) to the controller 515. The controller 515 controls the power amplifier 507 based on a control signal acquired from the signal processing circuit 601 through the plurality of control terminals 534. The control signal acquired by the controller 515 is a digital signal.

The switch 504 includes a common terminal 540 and a plurality (for example, two) of selection terminals 541 and 542. In the switch 504, the common terminal 540 is connected to the antenna terminal 531. The selection terminal 541 is connected to the first filter 1. The selection terminal 542 is connected to the second filter 2. The switch 504 is, for example, a switch that can connect one or more of the plurality of selection terminals 541 and 542 to the common terminal 540. In this case, the switch 504 is, for example, a switch capable of one-to-one connection and one-to-many connections. The switch 504 is controlled by, for example, the signal processing circuit 601. The switch 504 switches a connection state between the common terminal 540 and the plurality of selection terminals 541 and 542 in accordance with a control signal from an RF signal processing circuit 602 of the signal processing circuit 601. The switch 504 is, for example, a switch integrated circuit (IC).

(2.2) Circuit Configuration of First Filter

The first filter 1 includes an acoustic wave filter including a plurality of acoustic wave resonators. The acoustic wave filter provided in the first filter 1 is, for example, a ladder filter. For example, as shown in FIG. 5, the plurality of acoustic wave resonators include four series arm resonators S1, S2, S3, and S4 and four parallel arm resonators P1, P2, P3, and P4. The four series arm resonators S1, S2, S3, and S4 are provided on a first signal path Ru1 (also referred to as a series arm path Ru1 below) between the first input/output terminal T1 and the second input/output terminal T2. The four series arm resonators S1, S2, S3, and S4 are connected in series on the series arm path Ru1. In the acoustic wave filter, on the series arm path Ru1, the series arm resonator S1, the series arm resonator S2, the series arm resonator S3, and the series arm resonator S4 are arranged in order of the series arm resonator S1, the series arm resonator S2, the series arm resonator S3, and the series arm resonator S4 from the first input/output terminal T1 side. The parallel arm resonator P1 is provided on a path Ru11 (also referred to as a parallel arm path Ru11 below) between the ground and a path between the series arm resonator S1 and the series arm resonator S2 in the series arm path Ru1. The parallel arm resonator P2 is provided on a path Ru12 (also referred to as a parallel arm path Ru12 below) between the ground and a path between the series arm resonator S2 and the series arm resonator S3 in the series arm path Ru1. The parallel arm resonator P3 is provided on a path Ru13 (also referred to as a parallel arm path Ru13 below) between the ground and a path between the series arm resonator S3 and the series arm resonator S4 in the series arm path Ru1. The parallel arm resonator P4 is provided on a path Ru14 (also referred to as a parallel arm path Ru14 below) between the ground and a path between the series arm resonator S4 and the second input/output terminal T2 in the series arm path Ru1.

In the radio frequency module 500, the series arm resonator S1 defines the series arm resonator S01 (also referred to as the first series arm resonator S01 below) that is provided in the signal path Ru1 between the first input/output terminal T1 and the second input/output terminal T2, and is closest to the first input/output terminal T1 or the second input/output terminal. In the radio frequency module 500 according to Example Embodiment 1, the first series arm resonator S01 is a series arm resonator closest to the first input/output terminal T1 among the plurality of series arm resonators S1, S2, S3, and S4. The "series arm resonator S01 closest to the first input/output terminal T1" is a series arm resonator connected to the first input/output terminal T1 without passing through another series arm resonator. In other words, the "series arm resonator S01 closest to the first input/output terminal T1" is a series arm resonator that is electrically closest to the first input/output terminal T1 regardless of a physical distance. In addition, in the radio frequency module 500, the parallel arm resonator P1 is connected between the signal path Ru1 and the ground conductor portion 905 (see FIG. 1). The ground conductor portion 905 is connected to an external ground terminal of the mounting board 9. In the radio frequency module 500, as shown in FIG. 5, the parallel arm resonator P01 defines the parallel arm resonator P01 (also referred to as the first parallel arm resonator P01 below) closest to the series arm resonator S01. The ground conductor portion 905 is connected to an external ground terminal of the mounting board 9. The "parallel arm resonator P01 closest to the series arm resonator S01" is a parallel arm resonator connected to the series arm resonator S01 without passing through another series arm resonator and another parallel arm resonator. In other words, the "parallel arm resonator P01 closest to the series arm resonator S01" is a parallel arm resonator that is electrically closest to the series arm resonator S01 regardless of a physical distance.

(2.3) Circuit Configuration of Communication Device

As shown in FIG. 7, the communication device 600 includes the radio frequency module 500 and the signal processing circuit 601. The signal processing circuit 601 is connected to the radio frequency module 500. The communication device 600 further includes the antenna 610. The communication device 600 further includes a circuit board on which the radio frequency module 500 is mounted. The circuit board is, for example, a printed wiring board. The circuit board includes a ground electrode to which the ground potential is applied.

The signal processing circuit 601 includes, for example, the RF signal processing circuit 602 and a baseband signal processing circuit 603. The RF signal processing circuit 602 is, for example, a radio frequency integrated circuit (RFIC), and performs signal processing on a radio frequency signal. The RF signal processing circuit 602 performs signal processing such as, for example, up-conversion, on a radio frequency signal (transmission signal) output from the baseband signal processing circuit 603, and outputs the radio frequency signal subjected to the signal processing. In addition, the RF signal processing circuit 602 performs signal processing such as down-conversion, for example, on a radio frequency signal (reception signal) output from the radio frequency module 500, and outputs the radio frequency signal subjected to the signal processing, to the baseband signal processing circuit 603. The baseband signal processing circuit 603 is, for example, a baseband integrated circuit (BBIC). The baseband signal processing circuit 603 generates an I-phase signal and a Q-phase signal from the baseband signal. The baseband signal is, for example, an audio signal, an image signal, and the like input from the outside. The baseband signal processing circuit 603 performs IQ modulation processing by combining the I-phase signal and the Q-phase signal, and outputs the transmission signal. In this case, the transmission signal is generated as a modulation signal (IQ signal) obtained by performing amplitude modulation of a carrier wave signal having a predetermined frequency in a period longer than a period of the carrier wave signal. The reception signal processed by the baseband signal processing circuit 603 is used, for example, as an image signal for image display or as an audio signal for a call of a user of the communication device 600. The radio frequency module 500 transmits the radio frequency signal (reception signal and transmission signal) between the antenna 610 and the RF signal processing circuit 602 of the signal processing circuit 601.

(2.4) Structure of Radio Frequency Module

As shown in FIG. 1, the radio frequency module 500 includes the mounting board 9 and the first filter 1. In addition, the radio frequency module 500 includes the second filter 2, the low-noise amplifier 501, the power amplifier 507, the input matching circuit 503, the output matching circuit 508, and the switch 504 (see FIG. 7). Further, the radio frequency module 500 includes a plurality of external connection terminals. As shown in FIG. 7, the plurality of external connection terminals include the antenna terminal 531, the signal output terminal 532, the signal input terminal 533, the plurality of control terminals 534, and the plurality of external ground terminals (not shown). In addition, the radio frequency module 500 includes a resin layer (referred to as a first resin layer below), a metal electrode layer, and a second resin layer. In FIG. 1, the plurality of external connection terminals, the first resin layer, the metal electrode layer, and the second resin layer are not shown.

As shown in FIG. 1, the mounting board 9 includes a first main surface 91 and a second main surface 92 facing each other in the thickness direction D1 of the mounting board 9. Further, the mounting board 9 includes an outer peripheral surface. The outer peripheral surface of the mounting board 9 includes, for example, four side surfaces that connect an outer edge of the first main surface 91 and an outer edge of the second main surface 92 of the mounting board 9 to each other, and does not include the first main surface 91 and the second main surface 92. That is, the mounting board 9 is a multilayer board including, for example, a plurality of dielectric layers and a plurality of conductive layers. The plurality of dielectric layers and the plurality of conductive layers are laminated in the thickness direction D1 of the mounting board 9. The plurality of conductive layers are configured in a predetermined pattern determined for each layer. Each of the plurality of conductive layers includes one or a plurality of conductor portions in one plane perpendicular or substantially perpendicular to the thickness direction D1 of the mounting board 9. A material of each conductive layer is, for example, copper. The plurality of conductive layers include a ground layer. In the radio frequency module 500, the plurality of ground terminals T5 are electrically connected to the ground layer through a via-conductor and the like of the mounting board 9. The mounting board 9 is, for example, a low temperature co-fired ceramics (LTCC) substrate. The mounting board 9 is not limited to the LTCC substrate, and may be, for example, a printed wiring board, a high temperature co-fired ceramics (HTCC) substrate, or a resin multilayer board. An outer edge of the mounting board 9 has a quadrangular or substantially quadrangular shape in plan view in the thickness direction D1 of the mounting board 9.

Further, the mounting board 9 is not limited to the LTCC substrate, and may be, for example, a wiring structural body. The wiring structural body is, for example, a multilayer structural body. The multilayer structural body includes at least one insulating layer and at least one conductive layer. The insulating layer is configured in a predetermined pattern. In a case where a plurality of insulating layers are provided, the plurality of insulating layers are configured in a predetermined pattern determined for each layer. The conductive layer is configured in a predetermined pattern different from the predetermined pattern of the insulating layer. In a case where a plurality of conductive layers are provided, the plurality of conductive layers are configured in a predetermined pattern determined for each layer. The conductive layer may include one or a plurality of rewiring portions. In the wiring structural body, a first surface of two surfaces facing each other in the thickness direction of the multilayer structural body is the first main surface 91 of the mounting board 9, and a second surface is the second main surface 92 of the mounting board 9. The wiring structural body may be, for example, an interposer. The interposer may be an interposer including a silicon substrate or may be a substrate including multiple layers.

The first main surface 91 and the second main surface 92 of the mounting board 9 are spaced apart in the thickness direction D1 of the mounting board 9, and intersect with the thickness direction D1 of the mounting board 9. The first main surface 91 of the mounting board 9 is, for example, perpendicular or substantially perpendicular to the thickness direction D1 of the mounting board 9, and may include, for example, a side surface or the like of a conductor portion as a surface that is not perpendicular or substantially perpendicular to the thickness direction D1. In addition, for example, the second main surface 92 of the mounting board 9 is perpendicular or substantially perpendicular to the thickness direction D1 of the mounting board 9, but may include, for example, a side surface of the conductor portion or the like, as a surface that is not perpendicular or substantially perpendicular to the thickness direction D1. Further, for example, the first main surface 91 and the second main surface 92 of the mounting board 9 may include fine unevenness, a recess portion, or a projection portion. For example, when a recess portion is provided on the first main surface 91 of the mounting board 9, the inner surface of the recess portion is included in the first main surface 91.

In the radio frequency module 500, a plurality of first electronic components are mounted at the first main surface 91 of the mounting board 9. The phrase that "the first electronic component is disposed on the first main surface 91 of the mounting board 9" includes a case where the first electronic component is mounted (mechanically connected to) at the first main surface 91 of the mounting board 9 and a case where the first electronic component is electrically connected to (an appropriate conductor portion of) the mounting board 9. An outer edge of each of the plurality of first electronic components has, for example, a quadrangular or substantially quadrangular shape in plan view in the thickness direction D1 of the mounting board 9. The plurality of first electronic components include the first filter 1, the second filter 2 (see FIG. 7), the power amplifier 507 (see FIG. 7), and the controller 515 (see FIG. 7). In addition, the plurality of first electronic components include circuit elements (for example, inductors) of the input matching circuit 503 (see FIG. 7) and a plurality of circuit elements (for example, a plurality of inductors and a plurality of capacitors) of the output matching circuit 508 (see FIG. 7). Some circuit elements among the plurality of circuit elements of the output matching circuit 508 may be built in the mounting board 9. In addition, in the radio frequency module 500, a plurality of second electronic components are mounted at the second main surface 92 of the mounting board 9. The phrase that "the second electronic component is disposed on the second main surface 92 of the mounting board 9" includes a case where the second electronic component is mounted (mechanically connected to) on the second main surface 92 of the mounting board 9 and a case where the second electronic component is electrically connected to (an appropriate conductor portion of) the mounting board 9. The plurality of second electronic components include, for example, an IC chip including the low-noise amplifier and the switch 504.

Figure 4:
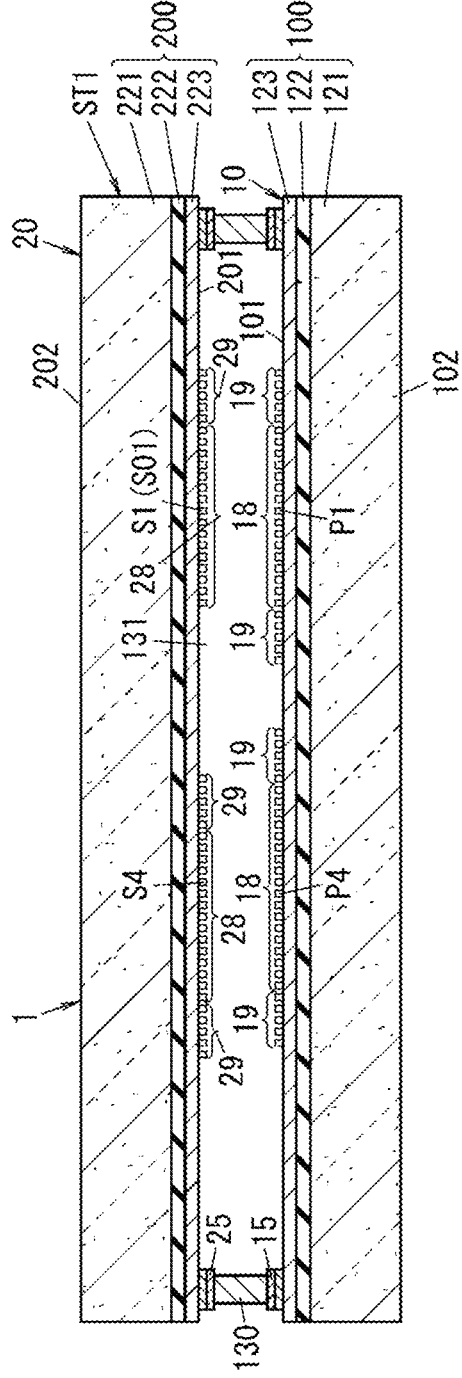
FIG. 4 is a schematic cross-sectional view of a filter in the radio frequency module according to Example Embodiment 1 of the present invention corresponding to an X1-X1 line cross section of FIGS. 3A and 3B.

As shown in FIG. 4, the first filter 1 includes a stack structure ST1 including the first chip 10, the second chip 20, and a spacer portion 130 that has a frame shape and is interposed between the first chip 10 and the second chip 20. The first filter 1 includes a hollow space 131 surrounded by the first chip 10, the second chip 20, and the spacer portion 130. In the radio frequency module 500, the thickness direction of the first chip 10 is parallel or substantially parallel to the thickness direction D1 of the mounting board 9. The thickness direction of the first chip 10 and the thickness direction D1 of the mounting board 9 are parallel or substantially parallel to each other, but are not limited to being strictly parallel to each other. It is sufficient that an angle between the thickness direction of the first chip 10 and the thickness direction D1 of the mounting board 9 is equal to or less than about 10°.

The second filter 2 includes an acoustic wave filter including a plurality of acoustic wave resonators.

An IC chip including the low-noise amplifier 501 (see FIG. 7) is mounted at the second main surface 92 of the mounting board 9. In plan view in the thickness direction D1 of the mounting board 9, an outer edge of the IC chip including the low-noise amplifier 501 has a quadrangular or substantially quadrangular shape.

The power amplifier 507 (see FIG. 7) is a power amplification IC chip. The power amplification IC chip is, for example, a GaAs IC chip in a case where an amplification transistor is a heterojunction bipolar transistor (HBT). In addition, the power amplification IC chip is, for example, a Si-based IC chip, for example, in a case where the amplification transistor is a bipolar transistor or a field effect transistor (FET).

The controller 515 (see FIG. 7) is an IC chip having a function of controlling the power amplifier 507. The IC chip is, for example, a Si-based IC chip.

The switch 504 (see FIG. 7) is, for example, a Si-based IC chip including a switch IC.

The plurality of external connection terminals are disposed on the second main surface 92 of the mounting board 9 (see FIG. 1). The phrase that "the external connection terminals are disposed on the second main surface 92 of the mounting board 9" means that the external connection terminals are mechanically connected to the second main surface 92 of the mounting board 9 and the external connection terminals are electrically connected to the (appropriate conductor portion of) mounting board 9. As described above, the plurality of external connection terminals include the antenna terminal 531, the signal output terminal 532, the signal input terminal 533, the plurality of control terminals 534, and the plurality of external ground terminals. The plurality of external ground terminals are electrically connected to a ground layer of the mounting board 9. The ground layer is a circuit ground of the radio frequency module 500, and the plurality of first electronic components of the radio frequency module 500 include electronic components that are electrically connected to the ground layer.

In addition, the plurality of second electronic components of the radio frequency module 500 include electronic components that are electrically connected to the ground layer.

The first resin layer is disposed on the first main surface 91 of the mounting board 9. The first resin layer includes resin (for example, epoxy resin). The first resin layer may include a filler in addition to the resin. The first resin layer has electrical insulating properties. The first resin layer covers at least a portion of each of the plurality of first electronic components disposed on the first main surface 91 of the mounting board 9.

The second resin layer is disposed on the second main surface 92 of the mounting board 9. The second resin layer covers at least a portion of each of the plurality of second electronic components mounted at the second main surface 92 of the mounting board 9 and the respective side surfaces of the plurality of external connection terminals. The second resin layer includes resin (for example, epoxy resin). The second resin layer may include a filler in addition to the resin. The material of the second resin layer may be the same material as the material of the first resin layer or may be a different material.

The metal electrode layer covers at least a portion of the first resin layer. The metal electrode layer has conductivity. In the radio frequency module 500, the metal electrode layer is a shield layer provided for the purpose of electromagnetic shielding inside and outside the radio frequency module 500. The metal electrode layer is in contact with at least a portion of an outer peripheral surface of the ground layer of the mounting board 9. As a result, it is possible to set a potential of the metal electrode layer to be the same or substantially the same as a potential of the ground layer. The metal electrode layer has a multilayer structure in which a plurality of metal layers are laminated. Meanwhile, the present invention is not limited to this, and include one metal layer. The metal layer includes one type or a plurality of types of metals. In a case where the metal electrode layer has a multilayer structure in which a plurality of metal layers are laminated, for example, a first metal layer (for example, a first stainless steel layer), a second metal layer (for example, a Cu layer) on the first metal layer, and a third metal layer (for example, a second stainless steel layer) on the second metal layer are provided. A material of each of the first stainless steel layer and the second stainless steel layer is, for example, an alloy including Fe, Ni, and Cr. In addition, the metal electrode layer is, for example, a Cu layer when the metal electrode layer includes one metal layer.

The stack structure ST1 including the first chip 10 and the second chip 20 will be described below with reference to FIGS. 1, 2, 3A, 3B, and 4.

The filter 1 includes the first input/output terminal T1, the second input/output terminal T2 (see FIG. 6), the ground terminal T5, the first series arm resonator S01, and the first parallel arm resonator P01. The first input/output terminal T1, the second input/output terminal T2, and the ground terminal T5 are connected to the first conductor portion 901, a second conductor portion (not shown), and the ground conductor portion 905 of the mounting board 9, respectively.

In the filter 1, as shown in FIG. 1, the first chip 10 is disposed on the mounting board 9, and the second chip 20 is disposed on the first chip 10. The first chip 10 includes a first resonator 11 that is one of the series arm resonator S01 and the parallel arm resonator P01. The second chip 20 includes a second resonator 12 that is the remaining one of the series arm resonator S01 and the parallel arm resonator P01. In the filter 1, the first resonator 11 and the second resonator 12 face each other in the thickness direction D1 of the mounting board 9. The filter 1 includes the first connection conductor portion 31 and the second connection conductor portion 32. The first connection conductor portion 31 and the second connection conductor portion 32 are interposed between the first chip 10 and the second chip 20 in the thickness direction D1 of the mounting board 9. The filter 1 further includes the spacer portion 130 that is interposed between the first chip 10 and the second chip 20 in the thickness direction D1 of the mounting board 9. The spacer portions 130 have a frame shape. The stack structure ST1 includes the hollow space 131 surrounded by the first chip 10, the second chip 20, and the spacer portion 130. The material of the spacer portion 130 includes, for example, at least one of metal and solder.

Figure 3A:
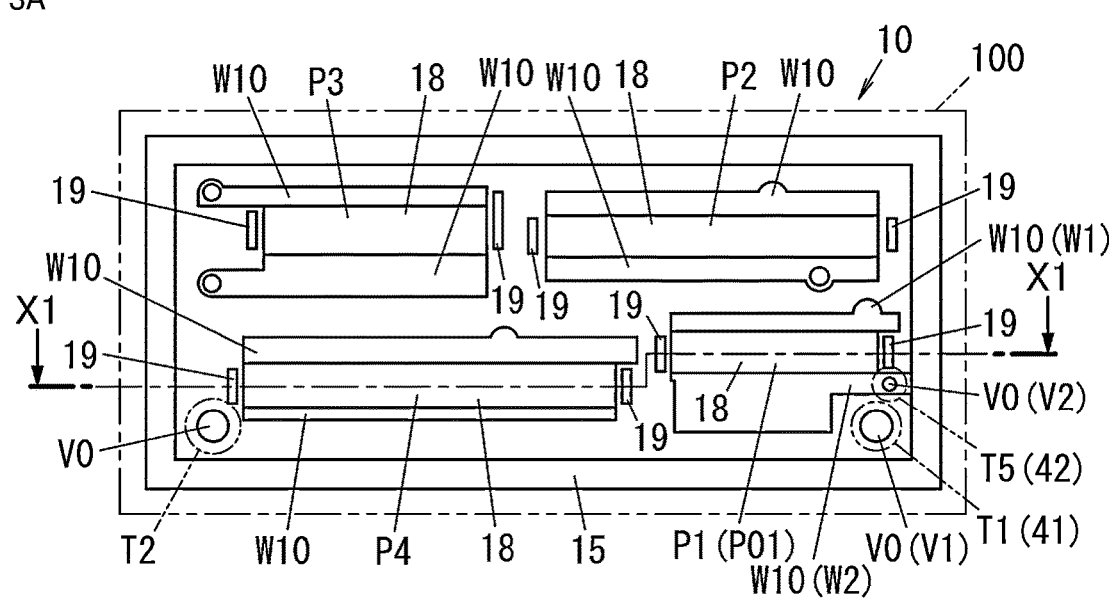
FIG. 3A is a transparent view of an upper surface of a first chip in the radio frequency module according to Example Embodiment 1 of the present invention as viewed from a lower surface side of the first chip transparently.

As shown in FIG. 1, the first chip 10 includes a first resonator 11 that is one of the first series arm resonator S01 and the first parallel arm resonator P01. In the radio frequency module 500 according to Example Embodiment 1, the first resonator 11 is the first parallel arm resonator P01. As shown in FIG. 3A, for example, the first chip 10 includes four parallel arm resonators P1, P2, P3, and P4. In the first chip 10, the parallel arm resonator P1 defines the first parallel arm resonator P01.

As shown in FIG. 3A, the first chip 10 includes a first substrate 100 and a plurality of functional electrodes 18 defining a portion of each of four parallel arm resonators P1 to P4. In the radio frequency module 500, the filter 1 is an acoustic wave filter using a surface acoustic wave, and each of the plurality of functional electrodes 18 is an interdigital transducer (IDT) electrode. Thus, each of the four parallel arm resonators P1 to P4 is a surface acoustic wave (SAW) resonator.

As shown in FIG. 1, the first substrate 100 includes a first main surface 101 on an opposite side of the mounting board 9 side and a second main surface 102 on the mounting board 9 side. As shown in FIG. 4, the first substrate 100 includes a piezoelectric layer 123 (also referred to as a first piezoelectric layer 123), and a high acoustic velocity member 121 (also referred to as a first high acoustic velocity member 121). The high acoustic velocity member 121 is a high acoustic velocity support substrate that is located on an opposite side of the functional electrode 18 with the piezoelectric layer 123 interposed therebetween. In the high acoustic velocity member 121, the acoustic velocity of a bulk wave propagating in the high acoustic velocity member 121 is higher than the acoustic velocity of an acoustic wave propagating in the piezoelectric layer 123. In this case, the bulk wave propagating in the high acoustic velocity member 121 is a bulk wave having the lowest acoustic velocity among a plurality of bulk waves propagating in the high acoustic velocity member 121. In addition, the first substrate 100 further includes a low acoustic velocity film 122 (also referred to as a first low acoustic velocity film 122 below) interposed between the high acoustic velocity member 121 and the piezoelectric layer 123. The low acoustic velocity film 122 is a film in which the acoustic velocity of a bulk wave propagating in the low acoustic velocity film 122 is lower than the acoustic velocity of a bulk wave propagating in the piezoelectric layer 123.

The material of the first piezoelectric layer 123 includes, for example, lithium tantalate or lithium niobate.

The material of the first high acoustic velocity member 121 includes, for example, silicon. The material of the first high acoustic velocity member 121 may include, for example, at least one material selected from the group consisting of silicon, aluminum nitride, aluminum oxide, silicon carbide, silicon nitride, sapphire, lithium tantalate, lithium niobate, quartz crystal, alumina, zirconia, cordierite, mullite, steatite, forsterite, magnesia, and diamond.

The material of the first low acoustic velocity film 122 includes, for example, silicon oxide. The material of the first low acoustic velocity film 122 is not limited to silicon oxide. The material of the first low acoustic velocity film 122 may be, for example, silicon oxide, glass, silicon oxynitride, tantalum oxide, a compound in which fluorine, carbon, or boron is added to silicon oxide, or a material including each of the above materials as a main component.

The plurality of functional electrodes 18 are disposed on the first main surface 101 of the first substrate 100. As described above, each of the plurality of functional electrodes 18 is an IDT electrode. In the radio frequency module 500 according to Example Embodiment 1, the functional electrode 18 corresponding to the first parallel arm resonator P01 among the plurality of functional electrodes 18 defines a first functional electrode E11 (see FIG. 1). The first functional electrode E11 defines a portion of the first resonator 11 (see FIG. 1).

In addition, as shown in FIGS. 3A and 4, the first chip 10 includes a plurality of (for example, eight in the shown example) reflectors 19 disposed on the first main surface 101 of the first substrate 100. The plurality of reflectors 19 include two reflectors 19 that are disposed to be adjacent to the IDT electrode for each of a plurality of IDT electrodes. The two reflectors 19 reflect an acoustic wave in which a direction in which a plurality of electrode fingers of the adjacent IDT electrodes are arranged is used as an acoustic wave propagation direction.

In addition, as shown in FIG. 3A, the first chip 10 includes a plurality of wiring portions W10 disposed on the first main surface 101 of the first substrate 100. Each of the plurality of wiring portions W10 defines a portion of at least one of the signal path Ru1 and the four parallel arm paths Ru11 to Ru14 shown in FIG. 5. The plurality of wiring portions W10 include the first wiring portion W1 (see FIGS. 1 and 3A) and second wiring portion W2 (see FIGS. 1 and 3A) described above.

In addition, as shown in FIGS. 3A and 4, the first chip 10 includes a first metal portion 15 that is disposed on the first main surface 101 of the first substrate 100. The first metal portion 15 has a rectangular or substantially rectangular frame shape along the outer edge of the first substrate 100 in plan view in the thickness direction D1 of the mounting board 9 (see FIG. 1). In plan view in the thickness direction D1 of the mounting board 9, the first metal portion 15 surrounds the plurality of functional electrodes 18, the plurality of reflectors 19, and the plurality of wiring portions W10.

In addition, the first chip 10 includes a plurality of through-via conductors V0 that penetrate the first substrate 100 in the thickness direction D1 of the mounting board 9 (see FIG. 1). The plurality of through-via conductors V0 include a first through-via conductor V1 and a second through-via conductor V2. In plan view in the thickness direction D1 of the mounting board 9, the first through-via conductor V1 overlaps the first input/output terminal T1 (first terminal 41). The first through-via conductor V1 is connected to the first input/output terminal T1. In plan view in the thickness direction D1 of the mounting board 9, the second through-via conductor V2 overlaps the ground terminal T5 (second terminal 42). In a case where the high acoustic velocity member 121 of the first substrate 100 is a silicon substrate, for example, an electrical insulating film is interposed between the plurality of through-via conductors V0 and the high acoustic velocity member 121. The material of the electrical insulating film includes, for example, silicon oxide.

In addition, the first chip 10 includes a plurality of external terminals that are disposed on the second main surface 102 of the first substrate 100. The plurality of external terminals include the first input/output terminal T1, the second input/output terminal T2, and the ground terminal T5. Each of the plurality of external terminals includes a conductive bump.

Figure 3B:
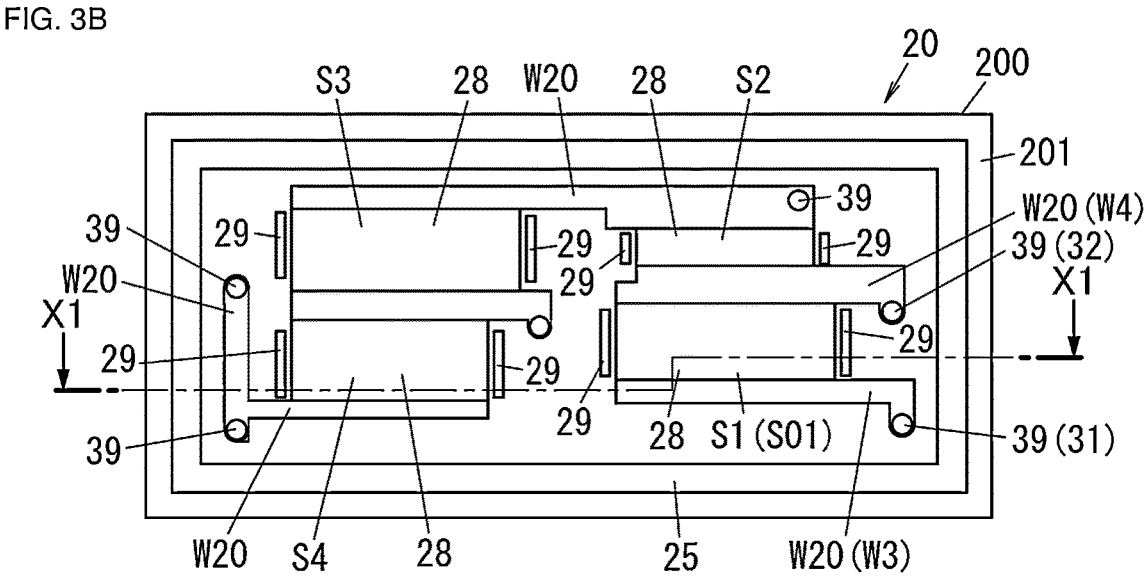
FIG. 3B is a bottom surface view of a second chip in the radio frequency module according to Example Embodiment 1 of the present invention.

As shown in FIG. 1, the second chip 20 includes the second resonator 12 that is the remaining one of the first series arm resonator S01 and the first parallel arm resonator P01. In the radio frequency module 500 according to Example Embodiment 1, the second resonator 12 is the first series arm resonator S01. As shown in FIG. 3B, the second chip 20 includes the four series arm resonators S1, S2, S3, and S4, for example. In the second chip 20, the series arm resonator S1 defines the first series arm resonator S01.

As shown in FIG. 3B, the second chip 20 includes a second substrate 200 and a plurality of functional electrodes 28 defining a portion of each of the four series arm resonators S1 to S4. Each of the plurality of functional electrodes 28 is an IDT electrode. Thus, each of the four series arm resonators S1 to S4 is a SAW resonator.

As shown in FIG. 1, the second substrate 200 includes a third main surface 201 on the first chip 10 side and a fourth main surface 202 on an opposite side of the first chip 10 side. As shown in FIG. 4, the second substrate 200 includes a piezoelectric layer 223 (also referred to as a second piezoelectric layer 223), and a high acoustic velocity member 221 (also referred to as a second high acoustic velocity member 221). The high acoustic velocity member 221 is a high acoustic velocity support substrate that is located on an opposite side of the functional electrode 28 with the piezoelectric layer 223 interposed therebetween. In the high acoustic velocity member 221, the acoustic velocity of a bulk wave propagating in the high acoustic velocity member 221 is higher than the acoustic velocity of an acoustic wave propagating in the piezoelectric layer 223. In this case, the bulk wave propagating in the high acoustic velocity member 221 is a bulk wave having the lowest acoustic velocity among a plurality of bulk waves propagating in the high acoustic velocity member 221. In addition, the second substrate 200 further includes a low acoustic velocity film 222 (also referred to as a second low acoustic velocity film 222 below) interposed between the high acoustic velocity member 221 and the piezoelectric layer 223. The low acoustic velocity film 222 is a film in which the acoustic velocity of a bulk wave propagating in the low acoustic velocity film 222 is lower than the acoustic velocity of a bulk wave propagating in the piezoelectric layer 223.

The material of the second piezoelectric layer 223 includes, for example, lithium tantalate or lithium niobate.

The material of the second high acoustic velocity member 221 includes, for example, silicon. The material of the second high acoustic velocity member 221 may include, for example, at least one material selected from the group consisting of silicon, aluminum nitride, aluminum oxide, silicon carbide, silicon nitride, sapphire, lithium tantalate, lithium niobate, quartz crystal, alumina, zirconia, cordierite, mullite, steatite, forsterite, magnesia, and diamond.

The material of the second low acoustic velocity film 222 includes, for example, silicon oxide. The material of the second low acoustic velocity film 222 is not limited to silicon oxide. The material of the second low acoustic velocity film 222 may be, for example, silicon oxide, glass, silicon oxynitride, tantalum oxide, a compound in which fluorine, carbon, or boron is added to silicon oxide, or a material having each of the above materials as a main component.

The plurality of functional electrodes 28 are disposed on the third main surface 201 of the second substrate 200. As described above, each of the plurality of functional electrodes 28 is an IDT electrode. In the radio frequency module 500 according to Example Embodiment 1, the functional electrode 28 corresponding to the first series arm resonator S01 among the plurality of functional electrodes 28 defines a second functional electrode E12 (see FIG. 1). The second functional electrode E12 defines a portion of the second resonator 12 (see FIG. 1).

In addition, as shown in FIGS. 3B and 4, the second chip 20 includes a plurality of (eight in the shown example) reflectors 29 disposed on the third main surface 201 of the second substrate 200. The plurality of reflectors 29 include two reflectors 29 that are disposed to be adjacent to the IDT electrode for each of the plurality of IDT electrodes. The two reflectors 29 reflect an acoustic wave in which a direction in which a plurality of electrode fingers of the adjacent IDT electrodes are arranged is used as an acoustic wave propagation direction.

In addition, as shown in FIG. 3B, the second chip 20 includes a plurality of wiring portions W20 disposed on the third main surface 201 of the second substrate 200. Each of the plurality of wiring portions W20 defines a portion of at least one of the signal path Ru1 or the four parallel arm paths Ru11 to Ru14 shown in FIG. 5. The plurality of wiring portions W20 include the third wiring portion W3 (see FIGS. 1 and 3B) and fourth wiring portion W4 (see FIGS. 1 and 3B) described above.

In addition, the second chip 20 includes a second metal portion 25 disposed on the third main surface 201 of the second substrate 200. The second metal portion 25 has a rectangular or substantially rectangular frame shape along the outer edge of the second substrate 200 in plan view in the thickness direction D1 of the mounting board 9 (see FIG. 1). In plan view in the thickness direction D1 of the mounting board 9, the second metal portion 25 surrounds the plurality of functional electrodes 28, the plurality of reflectors 29, and the plurality of wiring portions W20. In plan view in the thickness direction D1 of the mounting board 9, the second metal portion 25 overlaps the first metal portion 15 of the first chip 10. In the first filter 1, the first metal portion 15 of the first chip 10 is bonded to the second metal portion 25 of the second chip 20 with the spacer portion 130 interposed therebetween (in other words, the spacer portion 130 constitutes a bonding portion that bonds the first chip 10 and the second chip 20 to each other). In the first filter 1, as shown in FIG. 1, the first resonator 11 among the first substrate 100 and the first resonator 11 is located closer to the second chip 20 side than the first substrate 100, and the second resonator 12 among the second substrate 200 and the second resonator 12 is located closer to the first chip 10. In the first filter 1, in plan view in the thickness direction D1 of the mounting board 9, the first resonator 11 (first parallel arm resonator P01) overlaps the second resonator 12 (first series arm resonator S01). In the first filter 1, in plan view in the thickness direction D1 of the mounting board 9, a portion of the first resonator 11 overlaps a portion of the second resonator 12, but the present invention is not limited to this. A portion of the first resonator 11 may overlap the entirety or substantially the entirety of the second resonator 12, the entirety or substantially the entirety of the first resonator 11 may overlap a portion of the second resonator 12, or the entirety or substantially the entirety of the first resonator 11 may overlap the entirety or substantially the entirety of the second resonator 12. In the first filter 1, in plan view in the thickness direction D1 of the mounting board 9, not only the parallel arm resonator P1 defining the first parallel arm resonator P01 overlaps the series arm resonator S1 defining the first series arm resonator S01, but also the parallel arm resonator P2 (see FIG. 3A) overlaps the series arm resonator S2 (see FIG. 3B). In addition, in the first filter 1, in plan view in the thickness direction D1 of the mounting board 9, the parallel arm resonator P3 (see FIG. 3A) overlaps the series arm resonator S3 (see FIG. 3B). In addition, in the first filter 1, in plan view in the thickness direction D1 of the mounting board 9, the parallel arm resonator P4 (see FIG. 3A) overlaps the series arm resonator S4 (see FIG. 3B). In the first filter 1, the first metal portion 15 may be directly bonded to the second metal portion 25 without the spacer portion 130 interposed therebetween.

In addition, the first filter 1 includes a plurality of connection conductor portions 39 (see FIG. 3B) that connect the first chip 10 and the second chip 20. Each of the plurality of connection conductor portions 39 defines a portion of at least one of the signal path Ru1 and four parallel arm paths Ru11 to Ru14 shown in FIG. 5. The plurality of connection conductor portions 39 include the first connection conductor portion 31 (see FIGS. 1 and 3B) and the second connection conductor portion 32 (see FIGS. 1 and 3B) described above. Each of the plurality of connection conductor portions 39 includes, for example, a conductive bump. The plurality of connection conductor portions 39 are not elements of the second chip 20, but are shown in FIG. 3B in order to make a positional relationship with the second chip 20 easier to understand. The plurality of connection conductor portions 39 may be elements of the second chip 20.

In the radio frequency module 500, as shown in FIG. 1, the distance Le2 between the second through-via conductor V2 and the first through-via conductor V1 is shorter than the distance Le1 between the first wiring portion W1 and the first through-via conductor V1.

In addition, in the radio frequency module 500, a distance Le3 between the first resonator 11 (parallel arm resonator P01) and the first through-via conductor V1 is shorter than the distance Le1 between the first wiring portion W1 and the first through-via conductor V1.

In the radio frequency module 500, in the thickness direction D1 of the mounting board 9, the distance H2 (see FIG. 2) between the second wiring portion W2 and the ground conductor portion 905 is longer than the distance H1 (see FIG. 2) between the first wiring portion W1 and the fourth wiring portion W4.

In the radio frequency module 500, as described above, the current loop path Ro1 indicated by the thick arrow in FIG. 2 is provided. The current loop path Ro1 includes a path of the first conductor portion 901—the first terminal 41—the first through-via conductor V1—the first connection conductor portion 31—the third wiring portion W3—the second resonator 12—the fourth wiring portion W4—the second connection conductor portion 32—the first wiring portion W1—the first resonator 11—the second wiring portion W2—the second through-via conductor V2—the second terminal 42—the ground conductor portion 905. The current loop path Ro1 includes a path of the first input/output terminal T1—the series arm resonator S1—the parallel arm resonator P1—the ground (ground terminal T5) in the circuit diagram of FIG. 5. The current loop path Ro1 is not limited to this example, and may include a path of the second input/output terminal T2—the series arm resonator S4—the parallel arm resonator P3—the ground in the circuit diagram of FIG. 4.

(2.5) Structure of Communication Device

As shown in FIG. 7 described above, the communication device 600 includes the radio frequency module 500 and the signal processing circuit 601. The plurality of electronic components that define the signal processing circuit 601 may be mounted on, for example, the above-described circuit board, or may be mounted on a circuit board (second circuit board) different from the circuit board (first circuit board) on which the radio frequency module 500 is mounted.

(3) Advantageous Effects

(3.1) Radio Frequency Module

The radio frequency module 500 according to Example Embodiment 1 includes the mounting board 9 and the filter 1. The mounting board 9 includes the first conductor portion 901, the second conductor portion, and the ground conductor portion 905. The filter 1 is disposed on the mounting board 9. The filter 1 includes the first input/output terminal T1, the second input/output terminal T2, the ground terminal T5, the series arm resonator S01, and the parallel arm resonator P01. The first input/output terminal T1, the second input/output terminal T2, and the ground terminal T5 are connected to the first conductor portion 901, a second conductor portion, and the ground conductor portion 905, respectively. The series arm resonator S01 is provided in the signal path Ru1 between the first input/output terminal T1 and the second input/output terminal T2 and is closest to the first input/output terminal T1. The parallel arm resonator P01 is connected between the signal path Ru1 and the ground conductor portion 905 and is closest to the series arm resonator S01. In the filter 1, a first chip 10 is disposed on the mounting board 9, and a second chip 20 is disposed on the first chip 10. The first chip 10 includes a first resonator 11 that is one of the series arm resonator S01 and the parallel arm resonator P01. The second chip 20 includes a second resonator 12 that is the remaining one of the series arm resonator S01 and the parallel arm resonator P01. In the filter 1, the first resonator 11 and the second resonator 12 face each other in the thickness direction D1 of the mounting board 9. The filter 1 includes the first connection conductor portion 31 and the second connection conductor portion 32. The first connection conductor portion 31 and the second connection conductor portion 32 are interposed between the first chip 10 and the second chip 20 in the thickness direction D1 of the mounting board 9. The first chip 10 includes a first through-via conductor V1, a second through-via conductor V2, a first wiring portion W1, and a second wiring portion W2. The first through-via conductor V1 is interposed between the first terminal 41 and the first connection conductor portion 31. The first terminal 41 is the first input/output terminal T1. The second through-via conductor V2 is connected to the second terminal 42 in the thickness direction D1 of the mounting board 9. The second terminal 42 is the ground terminal T5. The first wiring portion W1 connects the second connection conductor portion 32 and the first resonator 11 to each other. The second wiring portion W2 connects the first resonator 11 and the second through-via conductor V2 to each other. The second chip 20 includes a third wiring portion W3 and a fourth wiring portion W4.

The third wiring portion W3 connects the first connection conductor portion 31 and the second resonator 12 to each other. The fourth wiring portion W4 connects the second resonator 12 and the second connection conductor portion 32 to each other. A distance Le2 between the second through-via conductor V2 and the first through-via conductor V1 is shorter than a distance Le1 between the first wiring portion W1 and the first through-via conductor V1.

With the radio frequency module 500 according to Example Embodiment 1, it is possible to reduce or prevent the deterioration in characteristics of the filter 1. More specifically, in the radio frequency module 500 according to Example Embodiment 1, since the distance Le2 between the second through-via conductor V2 and the first through-via conductor V1 is shorter than the distance Le1 between the first wiring portion W1 and the first through-via conductor V1, as compared to a case where the distance Le2 is longer than the distance Le1, it is possible to reduce the loop area of the current loop path Ro1 (see FIG. 2) including the first through-via conductor V1 and the second through-via conductor V2. As a result, in the radio frequency module 500 according to Example Embodiment 1, it is possible to narrow a range in which a magnetic field is generated by the current loop path Ro1, and it is possible to reduce or prevent inductive coupling between the current loop path Ro1 and another current loop path (for example, a current loop path provided over the second filter 2 and the mounting board 9). As a result, in the radio frequency module 500 according to Example Embodiment 1, it is possible to reduce or prevent the deterioration in attenuation characteristics of the filter 1 and to reduce or prevent the deterioration in characteristics of the filter 1. In the radio frequency module 500, in plan view in the thickness direction D1 of the mounting board 9, the direction of the radio frequency signal passing through the first resonator 11 is opposite to the direction of the radio frequency signal passing through the second resonator 12. In a case where the first resonator 11 is the parallel arm resonator PC, the radio frequency signal passing through the first resonator 11 is a radio frequency signal out of the pass band of the filter 1.

In addition, in the radio frequency module 500 according to Example Embodiment 1, a distance Le3 between the first resonator 11 and the first through-via conductor V1 is shorter than the distance Le1 between the first wiring portion W1 and the first through-via conductor V1. As a result, in the radio frequency module 500 according to Example Embodiment 1, it is possible to further reduce or prevent deterioration in the characteristics of the filter 1.

In addition, in the radio frequency module 500 according to Example Embodiment 1, the first chip 10 includes the plurality of parallel arm resonators P1 to P4 including the parallel arm resonator P01. The second chip 20 includes the plurality of series arm resonators S1 to S4 including the series arm resonator S01. In the filter 1, the plurality of parallel arm resonators P1 to P4 and the plurality of series arm resonators S1 to S4 correspond to each other on a one-to-one basis. In plan view in the thickness direction D1 of the mounting board 9, among the plurality of parallel arm resonators P1 to P4 and the plurality of series arm resonators S1 to S4, the parallel arm resonator and the series arm resonator corresponding to each other overlap each other. As a result, in the radio frequency module 500 according to Example Embodiment 1, as compared with a case where the parallel arm resonator and the series arm resonator corresponding to each other do not overlap each other, it is possible to reduce or prevent the variation in parasitic capacitance due to the variation in distance between the parallel arm resonator and the series arm resonator corresponding to each other. More specifically, in the radio frequency module 500, it is possible to reduce or prevent the variation in each of a plurality of parasitic capacitances C1, C2, C3, and C4 in the circuit diagram shown in FIG. 6. The parasitic capacitance C1 is a parasitic capacitance connected in parallel to a series circuit of the series arm resonator S1 and the parallel arm resonator P1. The parasitic capacitance C2 is a parasitic capacitance connected in parallel to a series circuit of the series arm resonator S2 and the parallel arm resonator P2. The parasitic capacitance C3 is a parasitic capacitance connected in parallel to a series circuit of the series arm resonator S3 and the parallel arm resonator P3. The parasitic capacitance C4 is a parasitic capacitance connected in parallel to the series circuit of the series arm resonator S4 and the parallel arm resonator P4.

(3.2) Communication Device

The communication device 600 according to Example Embodiment 1 includes the radio frequency module 500 and the signal processing circuit 601. The signal processing circuit 601 is connected to the radio frequency module 500.

With the communication device 600 according to Example Embodiment 1, it is possible to reduce or prevent the deterioration in the characteristics of the filter 1.

(4) Modified Examples of Example Embodiment 1

(4.1) Modified Example 1

Figure 8:
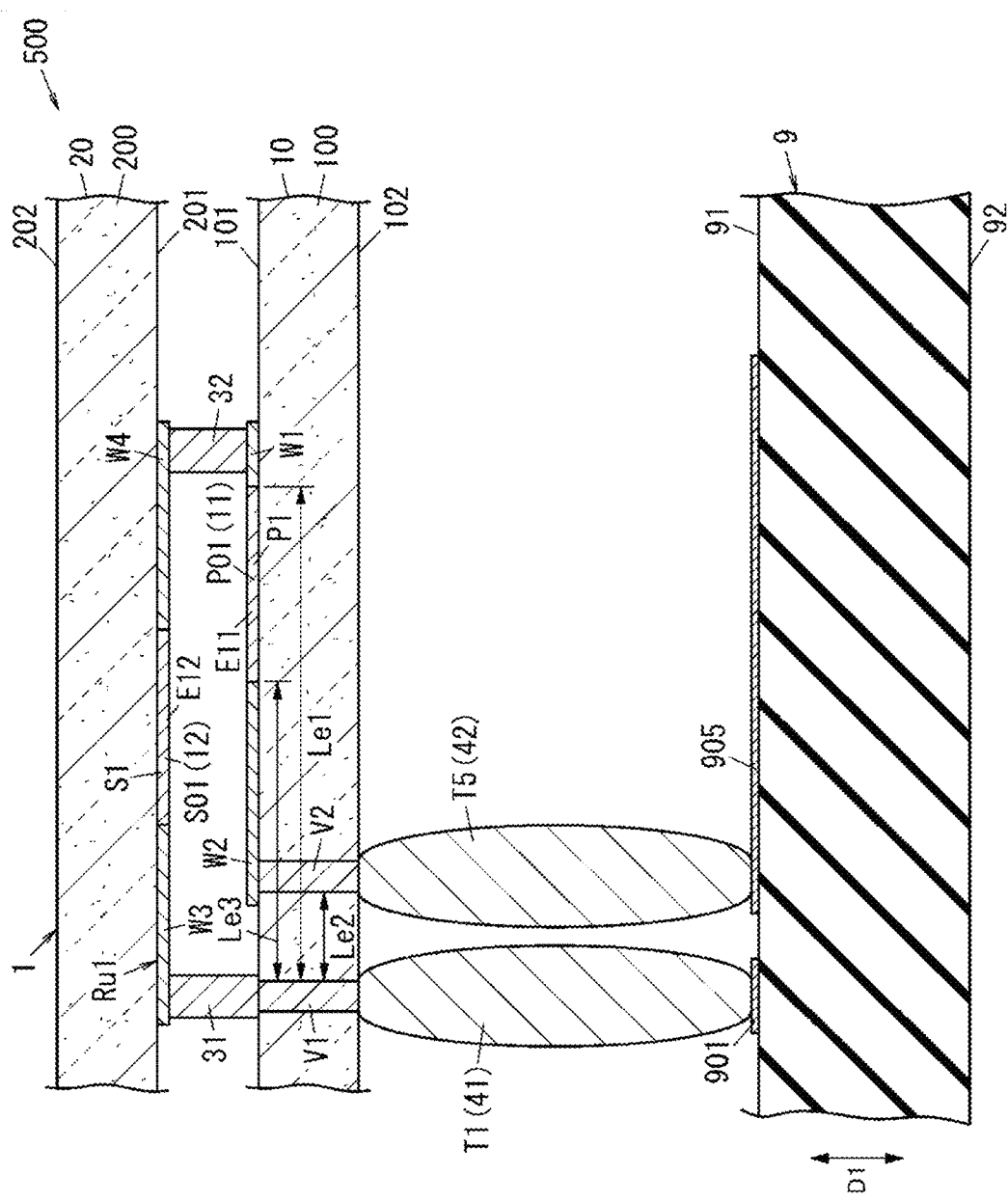
FIG. 8 is a cross-sectional view of a radio frequency module according to Modified example 1 of Example Embodiment 1 of the present invention.

A radio frequency module 500 according to Modified Example 1 will be described with reference to FIG. 8.

The circuit configuration of the radio frequency module 500 according to Modified Example 1 is the same or substantially the same as the circuit configuration of the radio frequency module 500 according to Example Embodiment 1 shown in FIG. 7. In addition, the circuit configuration of a filter 1 is the same or substantially the same as the circuit configuration of the filter 1 shown in FIG. 5.

The radio frequency module 500 according to Modified Example 1 is different from the radio frequency module 500 according to Example Embodiment 1 in that the first resonator 11 is farther from the first through-via conductor V1 than the second resonator 12 in plan view in the thickness direction D1 of the mounting board 9.

Similar to the radio frequency module 500 according to Example Embodiment 1, since the radio frequency module 500 according to Modified Example 1 satisfies a relationship in which the distance Le2 between the second through-via conductor V2 and the first through-via conductor V1 is shorter than the distance Le1 between the first wiring portion W1 and the first through-via conductor V1, it is possible to reduce or prevent the deterioration in the characteristics of the filter 1.

(4.2) Modified Example 2

A radio frequency module 500 according to Modified Example 2 will be described with reference to FIG. 9.

The circuit configuration of the radio frequency module 500 according to Modified Example 2 is the same or substantially the same as the circuit configuration of the radio frequency module 500 according to Example Embodiment 1 shown in FIG. 7. In addition, the circuit configuration of a filter 1 is the same or substantially the same as the circuit configuration of the filter 1 shown in FIG. 5.

Figure 9:
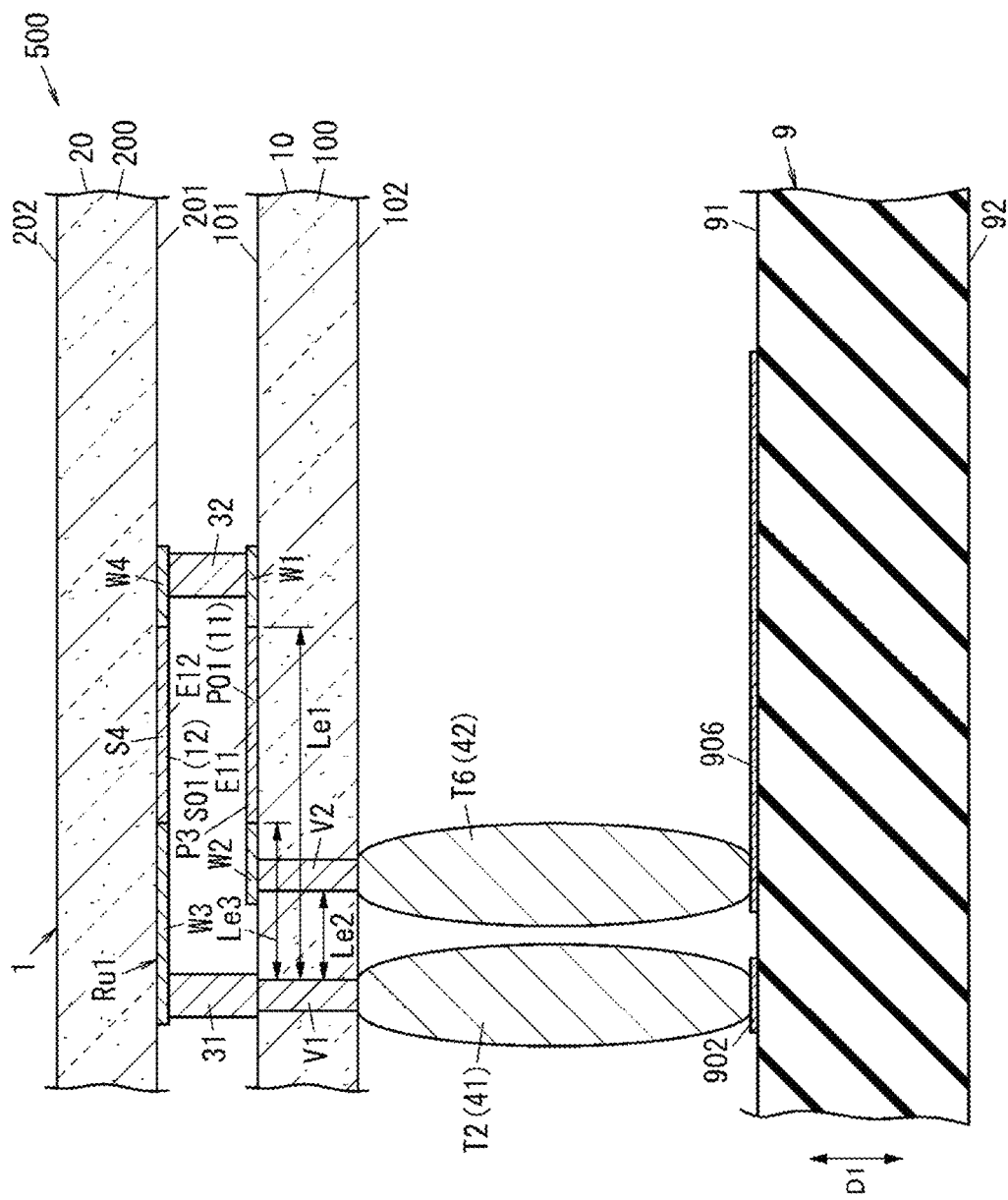
FIG. 9 is a cross-sectional view of a radio frequency module according to Modified example 2 of Example Embodiment 1 of the present invention.

The radio frequency module 500 according to Modified Example 2 is different from the radio frequency module 500 according to Example Embodiment 1 in that, as shown in FIG. 9, the series arm resonator S01 is defined by the series arm resonator S4 closest to the second input/output terminal T2 in the signal path Ru1, and the parallel arm resonator P01 is defined by the parallel arm resonator P3. Further, the radio frequency module 500 according to Modified Example 2 is different from the radio frequency module 500 according to Example Embodiment 1 in that the first terminal 41 is the second input/output terminal T2, and the second terminal 42 is the ground terminal T6. The mounting board 9 includes a ground conductor portion 906 connected to the ground terminal T6.

Similar to the radio frequency module 500 according to Example Embodiment 1, since the radio frequency module 500 according to Modified Example 2 satisfies a relationship in which the distance Le2 between the second through-via conductor V2 and the first through-via conductor V1 is shorter than the distance Le1 between the first wiring portion W1 and the first through-via conductor V1, it is possible to reduce or prevent the deterioration in the characteristics of the filter 1.

(4.3) Modified Example 3

Figure 10:
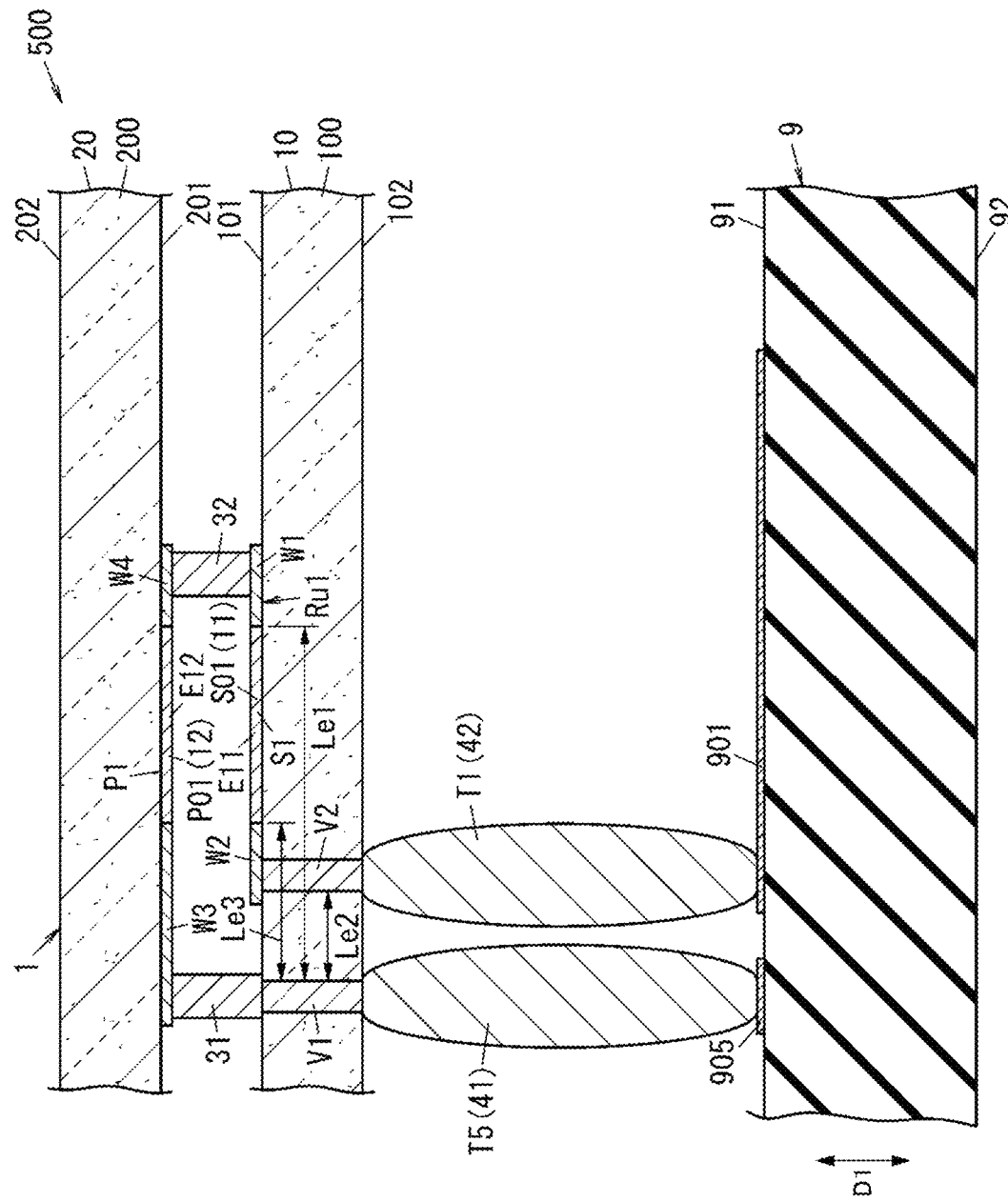
FIG. 10 is a cross-sectional view of a radio frequency module according to Modified example 3 of Example Embodiment 1 of the present invention.

A radio frequency module 500 according to Modified Example 3 will be described with reference to FIG. 10.

The circuit configuration of the radio frequency module 500 according to Modified Example 3 is the same or substantially the same as the circuit configuration of the radio frequency module 500 according to Example Embodiment 1 shown in FIG. 7. In addition, the circuit configuration of a filter 1 is the same or substantially the same as the circuit configuration of the filter 1 shown in FIG. 5.

The radio frequency module 500 according to Modified Example 3 is different from the radio frequency module 500 according to Example Embodiment 1 in that the second chip 20 includes four parallel arm resonators P1 to P4 (see FIG. 6) and the first chip 10 includes four series arm resonators S1 to S4. The radio frequency module 500 according to Modified Example 3 is different from the radio frequency module 500 according to Example Embodiment 1 in that the first series arm resonator S01 (series arm resonator S1) defines the first resonator 11 and the first parallel arm resonator P01 (parallel arm resonator P1) defines the second resonator 12. Further, the radio frequency module 500 according to Modified Example 3 is different from the radio frequency module 500 according to Example Embodiment 1 in that the ground terminal T5 defines the first terminal 41 and the first input/output terminal T1 defines the second terminal 42. In the radio frequency module 500 according to Modified Example 3, the second chip 20 includes a plurality of parallel arm resonators P1 to P4 including the parallel arm resonator P01. The first chip 10 includes a plurality of series arm resonators S1 to S4 including the series arm resonator S01. In the filter 1, the plurality of parallel arm resonators P1 to P4 and the plurality of series arm resonators S1 to S4 correspond to each other on a one-to-one basis. In plan view in the thickness direction D1 of the mounting board 9, among the plurality of parallel arm resonators P1 to P4 and the plurality of series arm resonators S1 to S4, the parallel arm resonator and the series arm resonator corresponding to each other overlap each other.

Similar to the radio frequency module 500 according to Example Embodiment 1, since the radio frequency module 500 according to Modified Example 3 satisfies a relationship in which the distance Le2 between the second through-via conductor V2 and the first through-via conductor V1 is shorter than the distance Le1 between the first wiring portion W1 and the first through-via conductor V1, it is possible to reduce or prevent the deterioration in the characteristics of the filter 1.

(4.4) Modified Example 4

A radio frequency module 500 according to Modified Example 4 will be described with reference to FIG. 11.

The circuit configuration of the radio frequency module 500 according to Modified Example 4 is the same or substantially the same as the circuit configuration of the radio frequency module 500 according to Example Embodiment 1 shown in FIG. 7. In addition, the circuit configuration of a filter 1 is the same or substantially the same as the circuit configuration of the filter 1 shown in FIG. 5.

Figure 11:
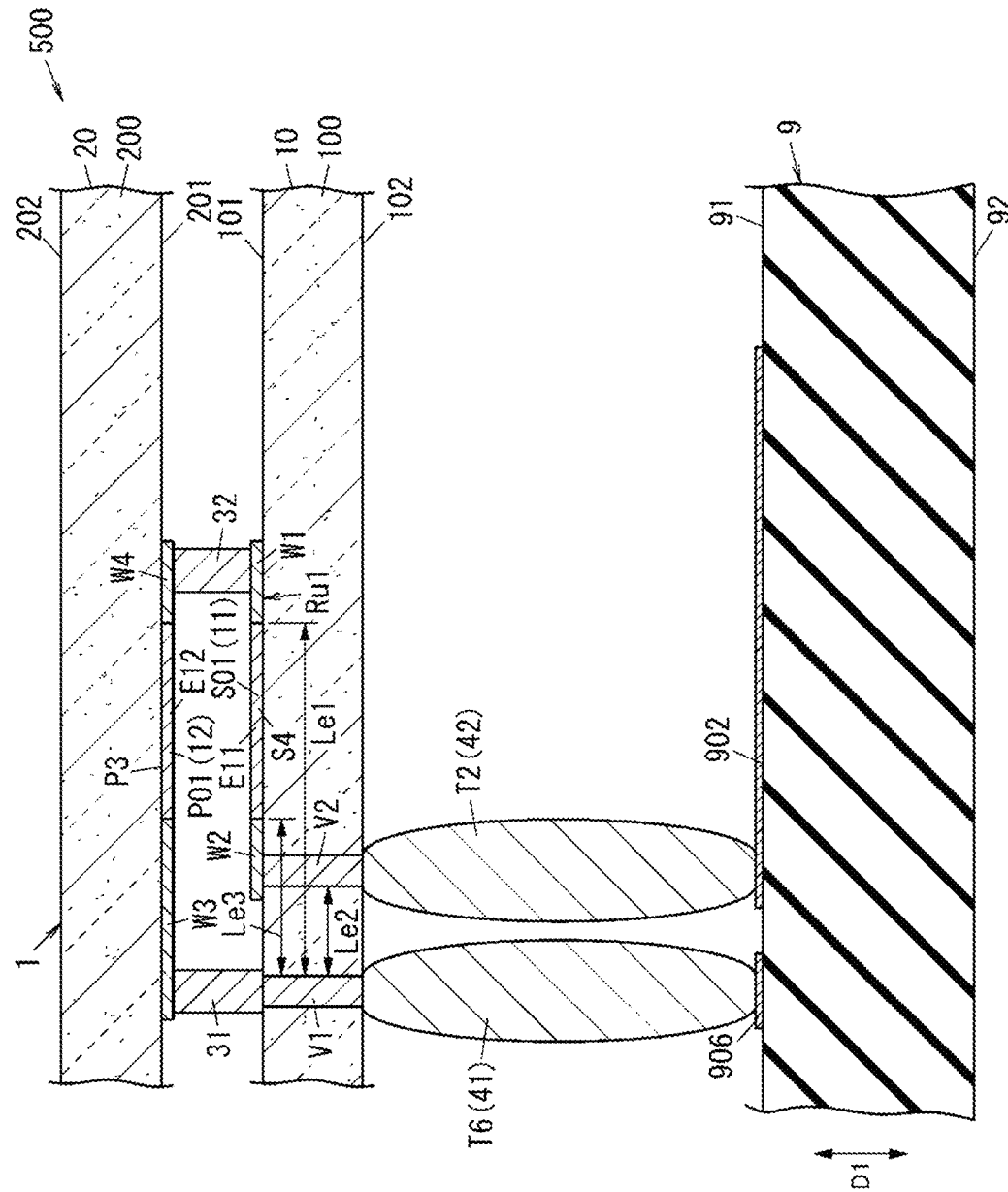
FIG. 11 is a cross-sectional view of a radio frequency module according to Modified example 4 of Example Embodiment 1 of the present invention.

The radio frequency module 500 according to Modified Example 4 is different from the radio frequency module 500 according to Modified Example 3 in that, as shown in FIG. 11, the series arm resonator S01 is defined by the series arm resonator S4 (see FIG. 5) closest to the second input/output terminal T2 in the signal path Ru1, and the parallel arm resonator P01 is defined by the parallel arm resonator P3. Further, the radio frequency module 500 according to Modified Example 4 is different from the radio frequency module 500 according to Modified Example 3 in that the second terminal 42 is the second input/output terminal T2, and the first terminal 41 is the ground terminal T6. The mounting board 9 includes a second conductor portion 902 connected to the second input/output terminal T2, and a ground conductor portion 906 connected to the ground terminal T6.

Similar to the radio frequency module 500 according to Example Embodiment 1, since the radio frequency module 500 according to Modified Example 4 satisfies a relationship in which the distance Le2 between the second through-via conductor V2 and the first through-via conductor V1 is shorter than the distance Le1 between the first wiring portion W1 and the first through-via conductor V1, it is possible to reduce or prevent the deterioration in the characteristics of the filter 1.

(4.5) Modified Example 5

Modified Example 5 of the radio frequency module 500 according to Example Embodiment 1 will be described below with reference to FIGS. 12, 13A, and 13B. Regarding Modified Example 5, the same or similar elements to those of the radio frequency module 500 according to Example Embodiment 1 will be denoted by the same reference signs, and the description thereof will be omitted.

Figure 12:
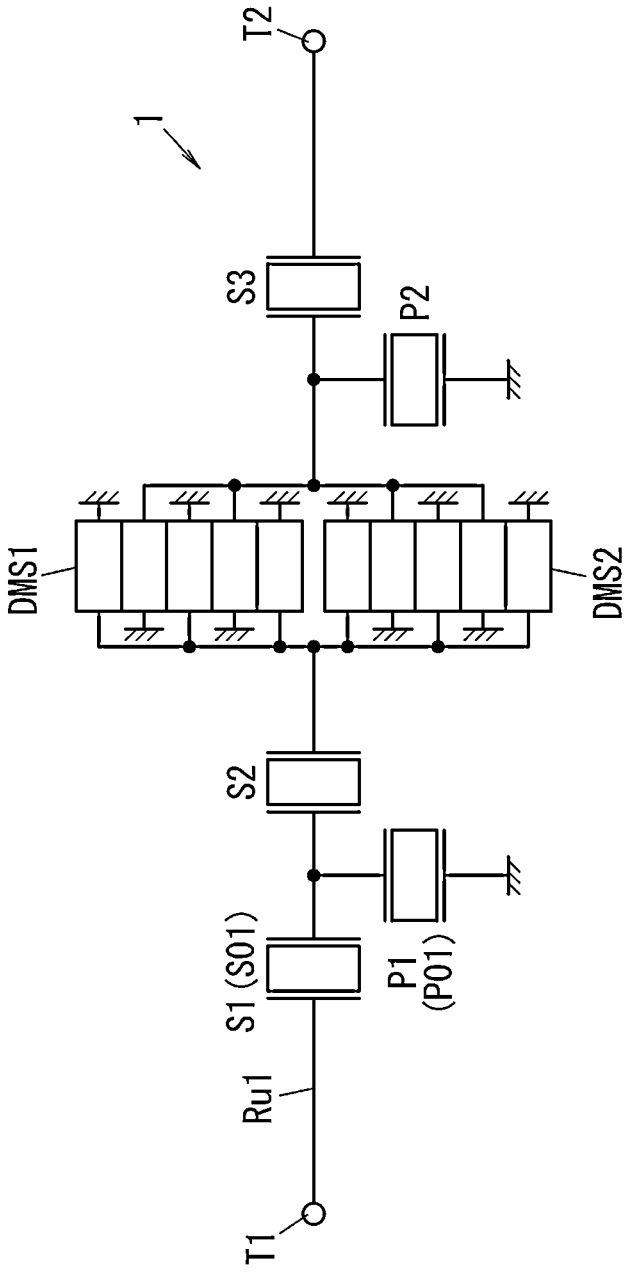
FIG. 12 is a circuit diagram of a filter in a radio frequency module according to Modified example 5 of Example Embodiment 1 of the present invention.

Modified Example 5 of the radio frequency module 500 according to Example Embodiment 1 is different from the radio frequency module 500 according to Example Embodiment 1 in that, as shown in FIG. 12, the first filter 1 includes three series arm resonators S1, S2, and S3, two longitudinally coupled resonators DMS1 and DMS2, and two parallel arm resonators P1 and P2. In Modified example 5, similar to Example Embodiment 1, the series arm resonator S1 defines the series arm resonator S01, and the parallel arm resonator P1 defines the parallel arm resonator P01. In addition, in Modified Example 5, a parallel circuit of the two longitudinally coupled resonators DMS1 and DMS2 are connected between the series arm resonator S2 and the series arm resonator S3.

A parallel circuit of the three series arm resonators S1 to S3 and the two longitudinally coupled resonators DMS1 and DMS2 is provided on the signal path Ru1 between the first input/output terminal T1 and the second input/output terminal T2.

Figure 13A:
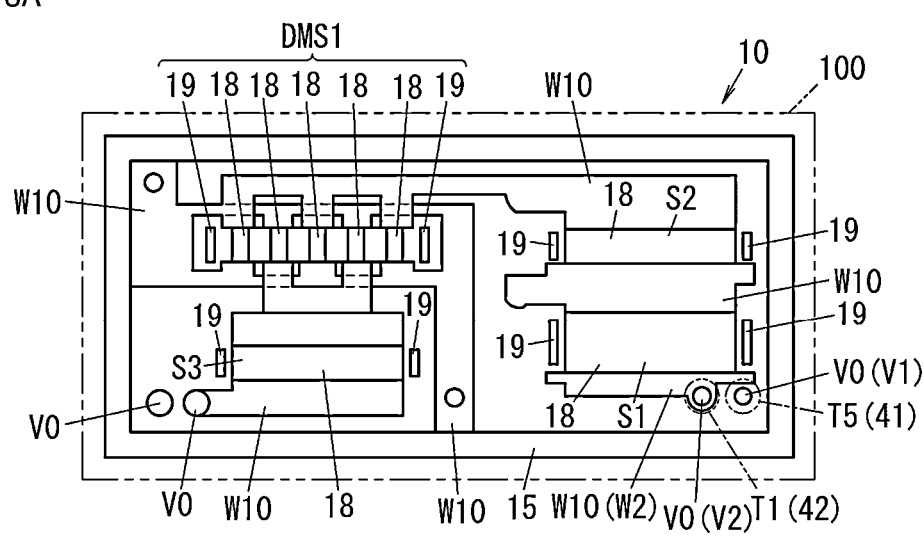
FIG. 13A is a transparent view of an upper surface of a first chip in the radio frequency module according to Modified example 5 of Example Embodiment 1 of the present invention as viewed from a lower surface side of the first chip transparently.
Figure 13B:
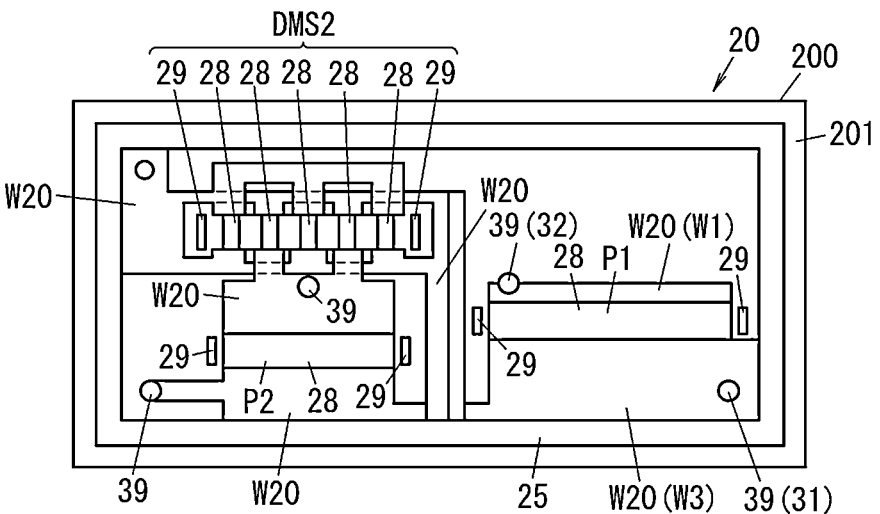
FIG. 13B is a bottom surface view of a second chip in the same radio frequency module.
Figure 14:
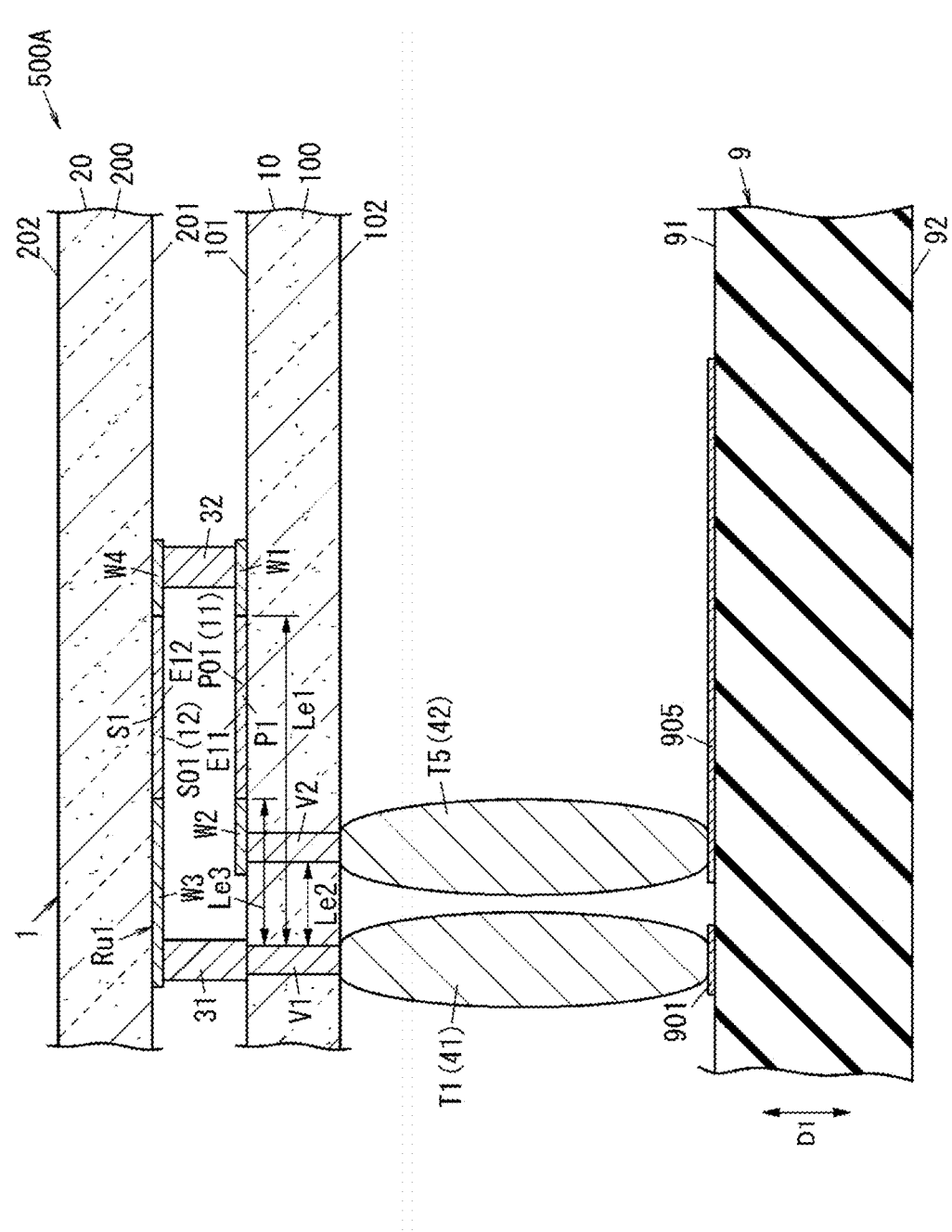
FIG. 14 is a cross-sectional view of a radio frequency module according to Example Embodiment 2 of the present invention.

In Modified Example 5, as shown in FIG. 13A, the first chip 10 includes the three series arm resonators S1 to S3 and the longitudinally coupled resonator DMS1, and the second chip 20 includes two parallel arm resonators P1 and P2 and the longitudinally coupled resonator DMS2. The longitudinally coupled resonator DMS1 includes two reflectors 19 and five functional electrodes 18 disposed between the two reflectors 19. Each of the five functional electrodes 18 in the longitudinally coupled resonator DMS1 is an IDT electrode. In addition, the longitudinally coupled resonator DMS2 includes two reflectors 29 and five functional electrodes 28 disposed between the two reflectors 29. Each of the five functional electrodes 28 in the longitudinally coupled resonator DMS2 is an IDT electrode.

In Modified Example 5, similar to the radio frequency module 500 according to Example Embodiment 1, in plan view in the thickness direction D1 of the mounting board 9 (see FIG. 1), the series arm resonator S01 (series arm resonator S1) overlaps the parallel arm resonator P01 (parallel arm resonator P1). In addition, in Modified Example 5, in plan view in the thickness direction D1 of the mounting board 9, the series arm resonator S3 overlaps the parallel arm resonator P2. In addition, in Modified Example 5, in plan view in the thickness direction D1 of the mounting board 9, the longitudinally coupled resonator DMS1 overlaps the longitudinally coupled resonator DMS2. In addition, in Modified Example 5, the series arm resonator S2 does not overlap any of the two parallel arm resonators P1 and P2 and the longitudinally coupled resonator DMS2.

Similar to the radio frequency module 500 according to Example Embodiment 1, since Modified Example 5 satisfies a relationship in which the distance Le2 between the second through-via conductor V2 and the first through-via conductor V1 is shorter than the distance Le1 between the first wiring portion W1 and the first through-via conductor V1, it is possible to reduce or prevent the deterioration in the characteristics of the filter 1.

(4.6) Another Modified Example of Example Embodiment 1

For example, the first substrate 100 in the first chip 10 may have a configuration including a first support substrate and a first high acoustic velocity film interposed between the first support substrate and the first low acoustic velocity film 122, instead of the first high acoustic velocity member 121. The first high acoustic velocity film is a film in which the acoustic velocity of a bulk wave propagating in the first high acoustic velocity film is faster than the acoustic velocity of an acoustic wave propagating in the first piezoelectric layer 123. In addition, the second substrate 200 in the second chip 20 may have, for example, a configuration including a second support substrate and a second high acoustic velocity film interposed between the second support substrate and the second low acoustic velocity film 222, instead of the second high acoustic velocity member 221. The second high acoustic velocity film is a film in which the acoustic velocity of a bulk wave propagating in the second high acoustic velocity film is faster than the acoustic velocity of an acoustic wave propagating in the second piezoelectric layer 223. A material of each of the first high acoustic velocity film and the second high acoustic velocity film is, for example, silicon nitride, but is not limited to silicon nitride, and may be at least one type of material selected from the group consisting of diamond-like carbon, aluminum nitride, silicon carbide, silicon oxynitride, silicon, sapphire, lithium tantalate, lithium niobate, quartz crystal, zirconia, cordierite, mullite, steatite, forsterite, magnesia, and diamond.

In addition, the first substrate 100 may include, for example, a first adhesion layer interposed between the first low acoustic velocity film 122 and the first piezoelectric layer 123. The first adhesion layer is made of, for example, a resin (epoxy resin, polyimide resin). In addition, the first substrate 100 may include a first dielectric film on any one of a position between the first low acoustic velocity film 122 and the first piezoelectric layer 123, a position above the first piezoelectric layer 123, and a position below the first low acoustic velocity film 122. In addition, the second substrate 200 may include, for example, a second adhesion layer interposed between the second low acoustic velocity film 222 and the second piezoelectric layer 223. The second adhesion layer is made of, for example, a resin (epoxy resin, polyimide resin). In addition, the second substrate 200 may include a second dielectric film on any one of a position between the second low acoustic velocity film 222 and the second piezoelectric layer 223, a position above the second piezoelectric layer 223, and a position below the second low acoustic velocity film 222. In addition, the first chip 10 may further include a first protective film that is provided on the first piezoelectric layer 123 and covers the plurality of functional electrodes 18 and the plurality of reflectors 19. A material of the first protective film is, for example, silicon oxide. In addition, the second chip 20 may further include a second protective film that is provided on the second piezoelectric layer 223 and covers the plurality of functional electrodes 28 and the plurality of reflectors 29. A material of the second protective film is, for example, silicon oxide.

In addition, in the first chip 10, the first substrate 100 defines a first piezoelectric substrate. However, the first piezoelectric substrate is not limited to a laminated substrate including the first high acoustic velocity member 121, the first low acoustic velocity film 122, and the first piezoelectric layer 123, and may be, for example, a first piezoelectric substrate. The first piezoelectric substrate is, for example, a lithium tantalate substrate or a lithium niobate substrate.

In addition, in the second chip 20, the second substrate 200 defines a second piezoelectric substrate. However, the second piezoelectric substrate is not limited to a laminated substrate including the second high acoustic velocity member 221, the second low acoustic velocity film 222, and the second piezoelectric layer 223, and may be, for example, a second piezoelectric substrate. The second piezoelectric substrate is, for example, a lithium tantalate substrate or a lithium niobate substrate.

Example Embodiment 2

A radio frequency module 500A according to Example Embodiment 2 of the present invention will be described with reference to FIGS. 14 to 17. Regarding the radio frequency module 500A according to Example Embodiment 2, the same or similar elements to those of the radio frequency module 500 according to Example Embodiment 1 will be denoted by the same reference signs, and the description thereof will be omitted.

In the radio frequency module 500A, the mounting board 9 further includes a third conductor portion 903 (see FIG. 15) and a ground conductor portion 907 (see FIG. 15) different from the first ground conductor portion 905, in addition to the first conductor portion 901, the second conductor portion (not shown), and the ground conductor portion 905 (also referred to as the first ground conductor portion 905). The mounting board 9 in FIG. 14 and the mounting board 9 in FIG. 15 are one mounting board 9.

The configuration of the first filter 1 is the same or substantially the same as that of the first filter 1 in the radio frequency module 500 according to Example Embodiment 1.

Figure 16:
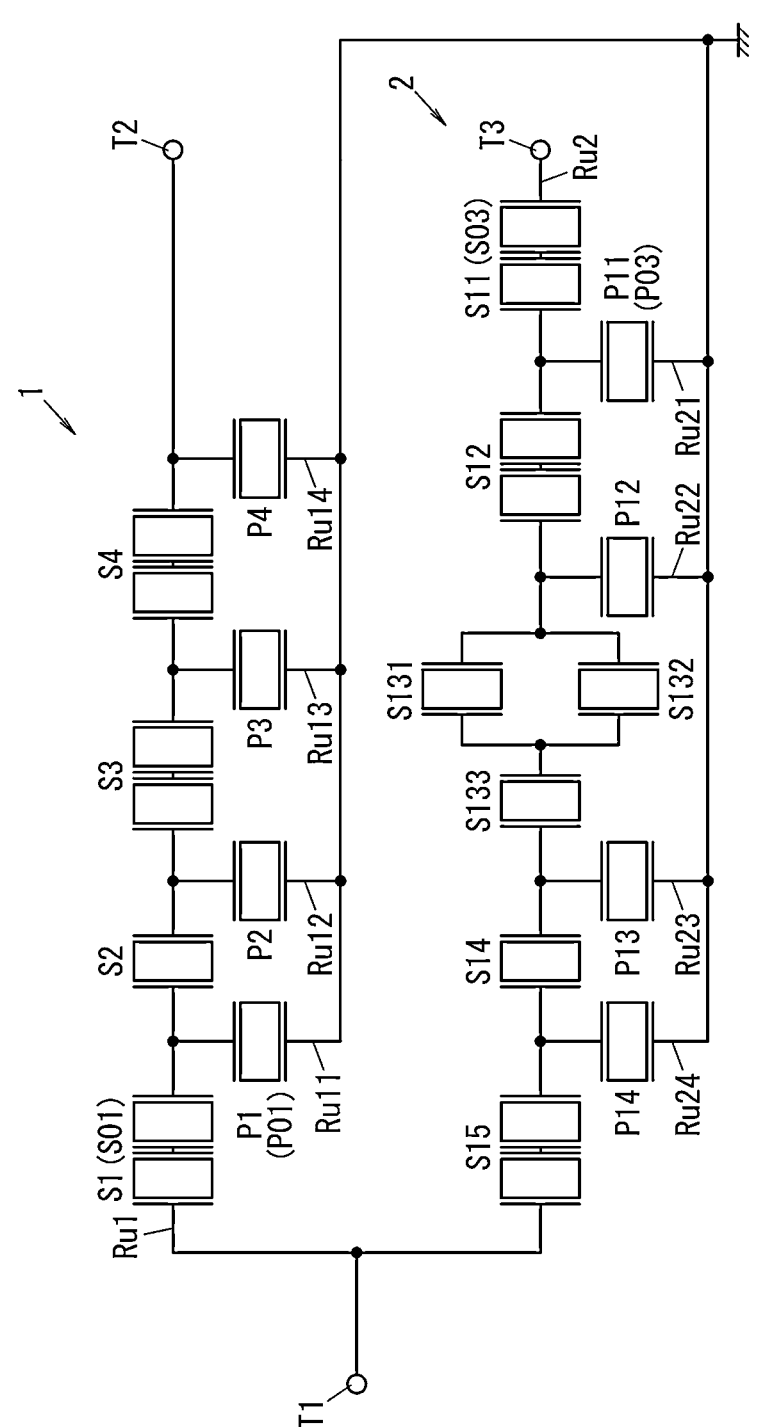
FIG. 16 is a circuit diagram of a first filter and a second filter in the radio frequency module according to Example Embodiment 2 of the present invention.
Figure 17:
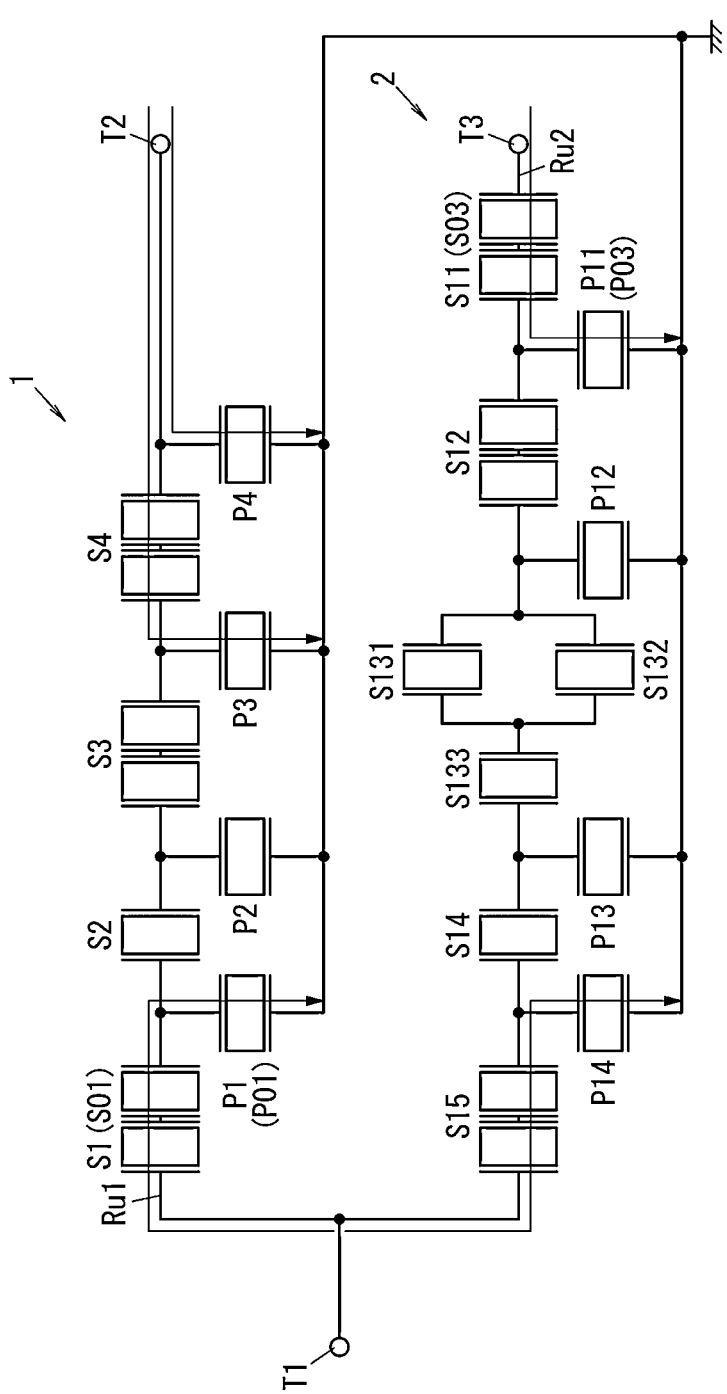
FIG. 17 is an explanatory diagram of a current loop path of each of the first filter and the second filter in the radio frequency module according to Example Embodiment 2 of the present invention.

The second filter 2 includes a plurality of acoustic wave resonators. For example, as shown in FIG. 16, the plurality of acoustic wave resonators include seven series arm resonators S11, S12, S131, S132, S133, S14, and S15, and four parallel arm resonators P11, P12, P13, and P14. The seven series arm resonators S11, S12, S131, S132, S133, S14, and S15 are provided on a second signal path Ru2 (also referred to as a series arm path Ru2 below) between the third input/output terminal T3 and the first input/output terminal T1. The parallel arm resonator P11 is provided on a path Ru21 (parallel arm path Ru21) between the ground and a path between the series arm resonator S11 and the series arm resonator S12 in the series arm path Ru2. The parallel arm resonator P12 is provided on a path Ru22 (parallel arm path Ru22) between the ground and a path between the series arm resonator S12 and a parallel circuit of the two series arm resonators S131 and S132 in the series arm path Ru2. The parallel arm resonator P13 is provided on a path Ru23 (parallel arm path Ru23) between the ground and a path between the series arm resonator S133 and the series arm resonator S14 in the series arm path Ru2. The parallel arm resonator P14 is provided on a path Ru24 (parallel arm path Ru24) between the ground and a path between the series arm resonator S14 and the series arm resonator S15 in the series arm path Ru2. In the example in FIG. 16, each of the three series arm resonators S11, S12, and S15 among the seven series arm resonators S11, S12, S131, S132, S133, S14, and S15 is configured by a plurality of (for example, two) split resonators, but the present disclosure is not limited to this. In addition, in the second filter 2, the series arm resonator S131 and the series arm resonator S132 are connected in parallel. Each of a plurality of paths indicated by arrows in FIG. 17 is a portion of a current loop path provided in the same or similar manner to the current loop path Ro1 described in Example Embodiment 1.

Figure 15:
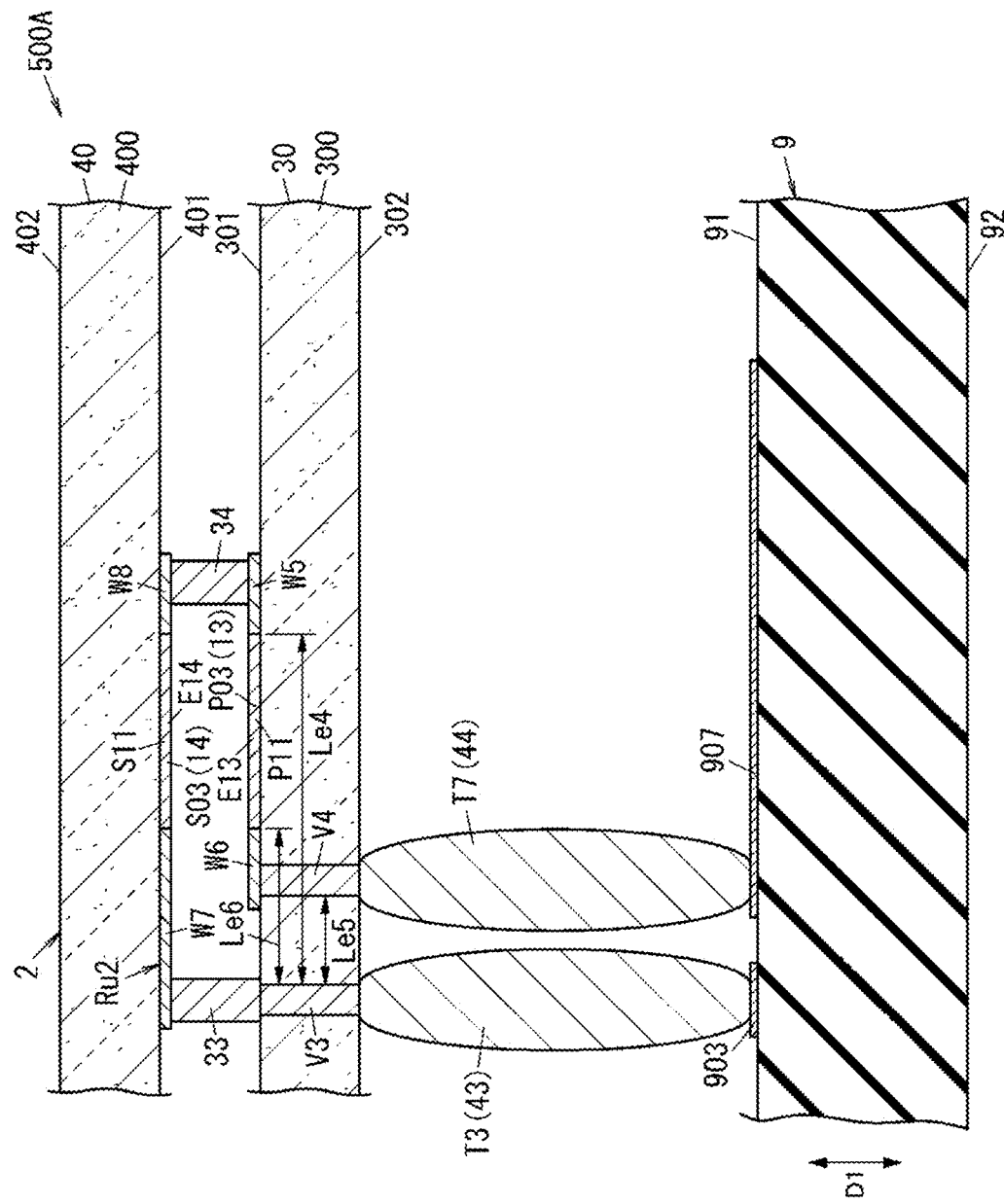
FIG. 15 is another cross-sectional view of the radio frequency module according to Example Embodiment 2 of the present invention.

As shown in FIG. 15, the second filter 2 includes a third input/output terminal T3, a ground terminal T7, a series arm resonator S03, and a parallel arm resonator P03. The third input/output terminal T3 is connected to the third conductor portion 903. The ground terminal T7 is connected to the ground conductor portion 907, differing from the first ground terminal T5 that is the ground terminal T5. The series arm resonator S03 is provided in the second signal path Ru2 between the first input/output terminal T1 and the third input/output terminal T3, which is different from the first signal path Ru1 that is the signal path Ru1. The series arm resonator S03 is closest to the third input/output terminal T3. The parallel arm resonator P03 is connected to the second signal path Ru2 and the ground conductor portion 907 and is closest to the series arm resonator S03. In the second filter 2, the third chip 30 is disposed on the mounting board 9, and the fourth chip 40 is disposed on the third chip 30.

The third chip 30 includes a third resonator 13 that is one of the series arm resonator S03 and the parallel arm resonator P03. The fourth chip 40 includes a fourth resonator 14 that is the remaining one of the series arm resonator S03 and the parallel arm resonator P03. In the second filter 2, the series arm resonator S03 and the parallel arm resonator P03 face each other in the thickness direction D1 of the mounting board 9.

The second filter 2 includes a third connection conductor portion 33 and a fourth connection conductor portion 34. The third connection conductor portion 33 and the fourth connection conductor portion 34 are interposed between the third chip 30 and the fourth chip 40 in the thickness direction D1 of the mounting board 9.

The third chip 30 includes a third through-via conductor V3, a fourth through-via conductor V4, a fifth wiring portion W5, and a sixth wiring portion W6. The third through-via conductor V3 is interposed between the third connection conductor portion 33 and a third terminal 43 that is one of the third input/output terminal T3 and the second ground terminal T6, in the thickness direction D1 of the mounting board 9. It is sufficient that the third through-via conductor V3 is electrically connected to the third terminal 43 in the third chip 30, and it is not necessary that the third through-via conductor V3 overlaps the third terminal 43 in the thickness direction D1 of the mounting board 9. The fourth through-via conductor V4 overlaps a fourth terminal 44 that is the remaining one of the third input/output terminal T3 and the second ground terminal T6, in the thickness direction D1 of the mounting board 9. It is sufficient that the fourth through-via conductor V4 is electrically connected to the fourth terminal 44 in the third chip 30, and it is not necessary that the fourth through-via conductor V4 overlaps the fourth terminal 44 in the thickness direction D1 of the mounting board 9.

The fifth wiring portion W5 connects the fourth connection conductor portion 34 and the third resonator 13 to each other. The sixth wiring portion W6 connects the third resonator 13 and the fourth through-via conductor V4 to each other. The fourth chip 40 includes a seventh wiring portion W7 and an eighth wiring portion W8. The seventh wiring portion W7 connects the third connection conductor portion 33 and the fourth resonator 14 to each other. The eighth wiring portion W8 connects the fourth resonator 14 and the fourth connection conductor portion 34 to each other. A distance Le5 between the fourth through-via conductor V4 and the third through-via conductor V3 is shorter than a distance Le4 between the fifth wiring portion W5 and the third through-via conductor V3.

The third chip 30 includes a third substrate 300 and a third functional electrode E13. The third substrate 300 includes a fifth main surface 301 on an opposite side of the mounting board 9 side and a sixth main surface 302 on the mounting board 9 side. The third substrate 300 is a third piezoelectric substrate, and is a laminated substrate the same as or similar to the first piezoelectric substrate defining the first substrate 100, but the present invention is not limited to this. The third substrate 300 may be a piezoelectric substrate the same as or similar to the first piezoelectric substrate. The third functional electrode E13 is a functional electrode of the parallel arm resonator P03 (parallel arm resonator P11) among a plurality of functional electrodes (IDT electrodes) provided on the fifth main surface 301 of the third substrate 300. The third functional electrode E13 defines a portion of the third resonator 13.

The third through-via conductor V3 and the fourth through-via conductor V4 penetrate the third substrate 300. The fifth wiring portion W5 and the sixth wiring portion W6 are disposed on the fifth main surface 301 of the third substrate 300.

The fourth chip 40 includes a fourth substrate 400 and a fourth functional electrode E14. The fourth substrate 400 includes a seventh main surface 401 on the third chip 30 side and an eighth main surface 402 on an opposite side of the third chip 30 side. The fourth substrate 400 is a fourth piezoelectric substrate, and is a laminated substrate the same as or similar to the second piezoelectric substrate defining the second substrate 200, but the present invention is not limited to this. The fourth substrate 400 may be a piezoelectric substrate similar to the second piezoelectric substrate. The fourth functional electrode E14 is a functional electrode of the series arm resonator S03 (series arm resonator S11) among a plurality of functional electrodes (IDT electrodes) provided on the seventh main surface 401 of the fourth substrate 400. The fourth functional electrode E14 defines a portion of the fourth resonator 14.

The seventh wiring portion W7 and the eighth wiring portion W8 are disposed on the seventh main surface 401 of the fourth substrate 400.

In the radio frequency module 500A according to Example Embodiment 2, the distance Le5 between the fourth through-via conductor V4 and the third through-via conductor V3 is shorter than a distance Le6 between the third resonator 13 and the third through-via conductor V3. As a result, with the radio frequency module 500A according to Example Embodiment 2, it is possible to reduce or prevent the deterioration in characteristics of the second filter 2.

In the radio frequency module 500A according to Example Embodiment 2, it is possible to reduce or prevent the deterioration in filter characteristics of each of the first filter 1 and the second filter 2. More specifically, in the radio frequency module 500A according to Example Embodiment 2, it is possible to reduce or prevent the deterioration in attenuation characteristics of a low frequency side and a high frequency side of the pass band (corresponding to the reception band of Band25) of the first filter, and it is possible to reduce or prevent the deterioration in attenuation characteristics of the low frequency side and the high frequency side of the pass band (corresponding to the transmission band of Band25) of the second filter 2.

Figures 18A, 18B:
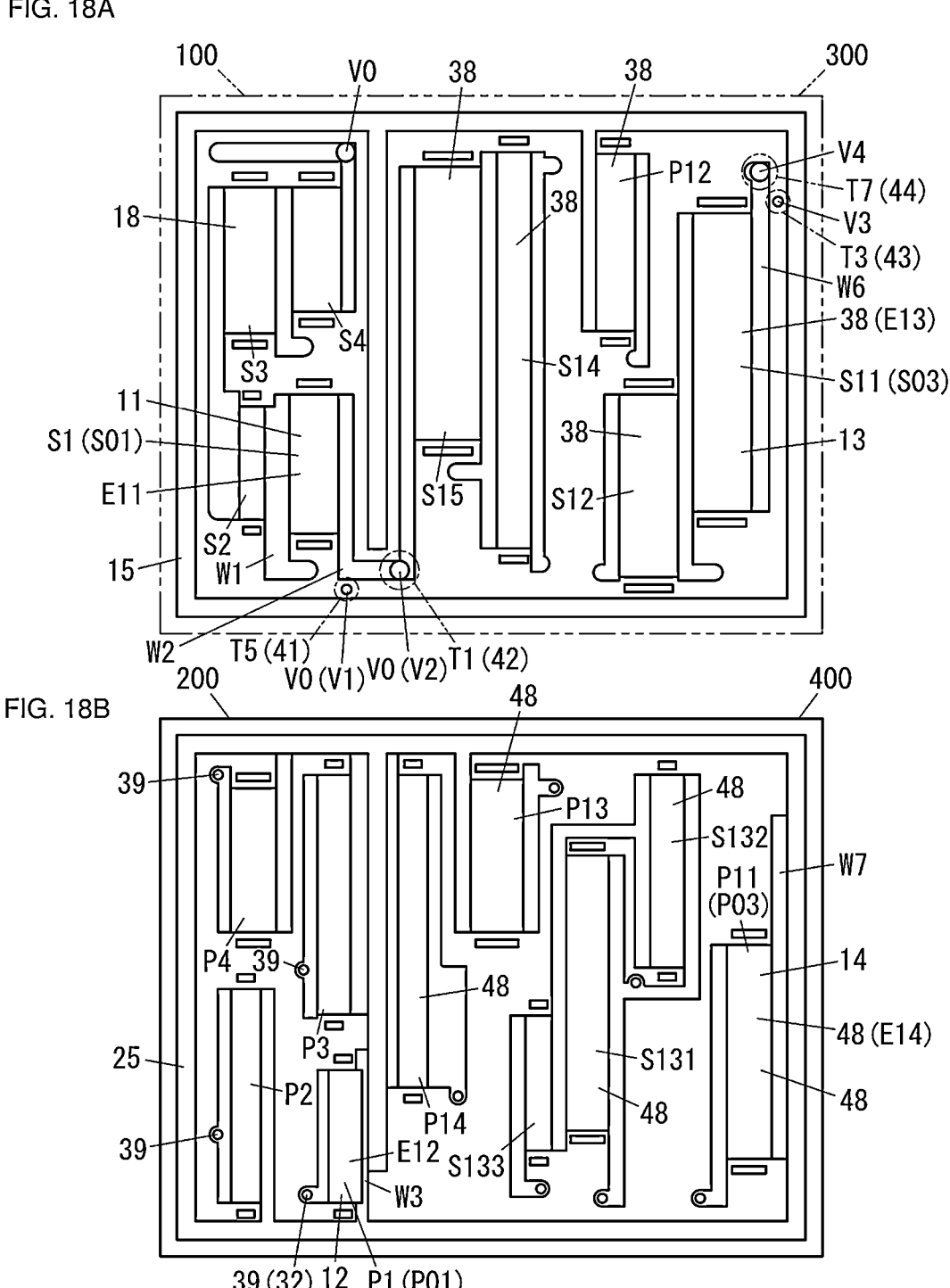
FIG. 18A is a transparent view of upper surfaces of a first chip and a third chip in a radio frequency module according to Modified example 1 of Example Embodiment 2 of the present invention as viewed from a lower surface side transparently.
FIG. 18B is a bottom surface view of a second chip and a fourth chip in the radio frequency module according to Modified example 1 of Example Embodiment 2 of the present invention.
Figures 19A, 19B:
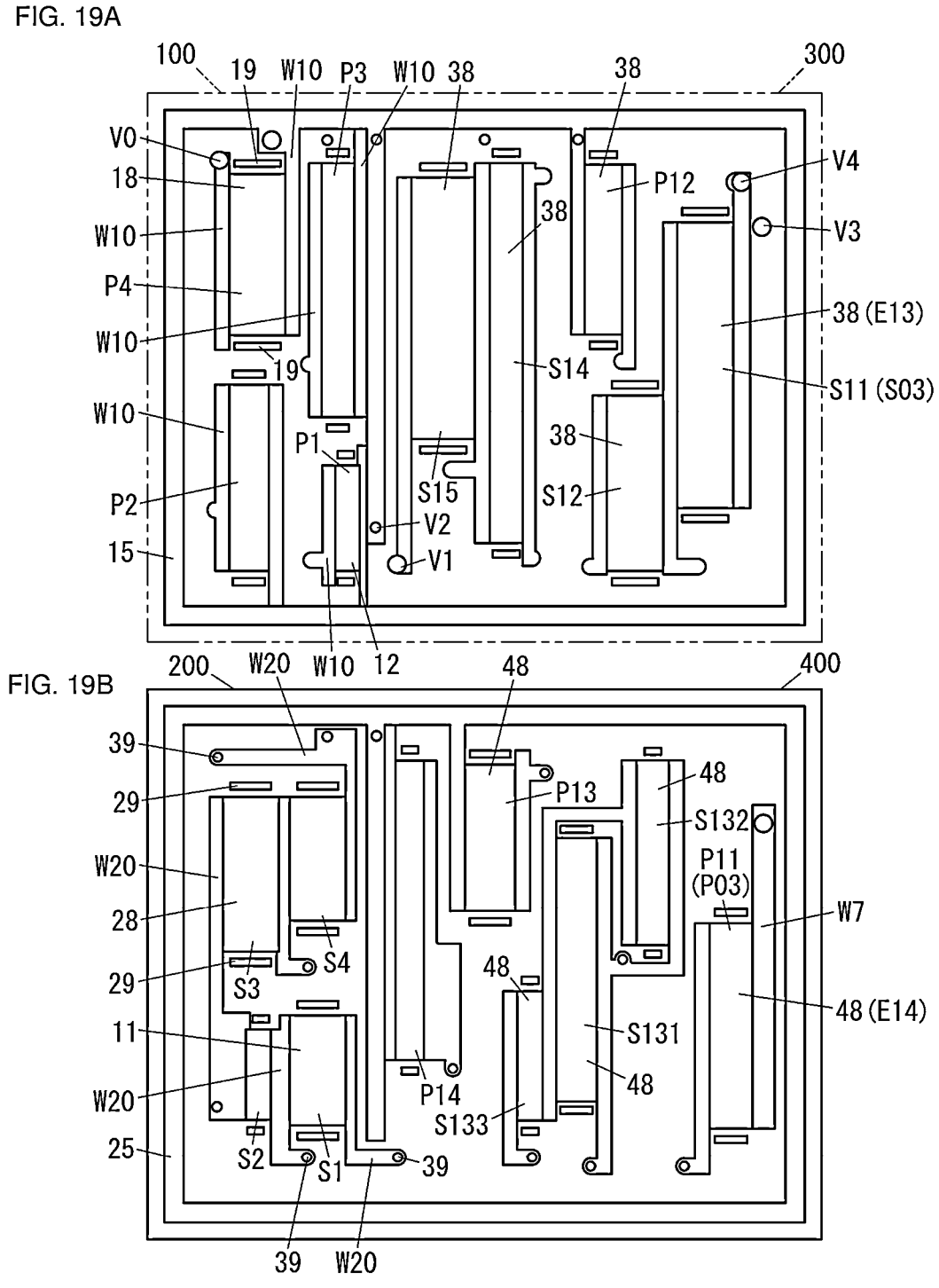
FIG. 19A is a transparent view of upper surfaces of a first chip and a third chip in a radio frequency module according to Modified example 2 of Example Embodiment 2 of the present invention as viewed from a lower surface side transparently.
FIG. 19B is a bottom surface view of a second chip and a fourth chip in the radio frequency module according to Modified example 2 of Example Embodiment 2 of the present invention.

In Modified Example 1 of the radio frequency module 500A, the first substrate 100 and the third substrate 300 are common as shown in FIG. 18A, and the second substrate 200 and the fourth substrate 400 are common as shown in FIG. 18B. In Modified Example 1, it is possible to reduce the size of the radio frequency module 500A. In FIG. 18A, a plurality of functional electrodes 38 are provided on the fifth main surface 301 (see FIG. 15) of the third substrate 300, and one functional electrode 38 of the plurality of functional electrodes 38 defines the above-described third functional electrode E13. In addition, in FIG. 18B, a plurality of functional electrodes 48 are provided on the seventh main surface 401 (see FIG. 15) of the fourth substrate 400, and one functional electrode 48 of the plurality of functional electrodes 48 defines the above-described fourth functional electrode E14. In Modified Example 1 of the radio frequency module 500A, similar to the radio frequency module 500 (see FIG. 10) according to Modified Example 3 of Example Embodiment 1, a portion corresponding to the first chip 10 including the first substrate 100 includes the four series arm resonators S1 to S4 of the first filter 1, and a portion corresponding to the second chip 20 including the second substrate 200 includes the four parallel arm resonators P1 to P4 of the first filter 1. In addition, in Modified Example 1 of the radio frequency module 500A, a portion corresponding to the third chip 30 including the third substrate 300 includes the four series arm resonators S11, S12, S14, and S15 and the one parallel arm resonator P12 of the second filter 2, and a portion corresponding to the fourth chip 40 including the fourth substrate 400 includes the two series arm resonators S131 and S132 and the three parallel arm resonators P11, P13, and P14 of the second filter 2. In addition, Modified Example 2 of the radio frequency module 500A is different from Modified Example 1 of the radio frequency module 500A in that, as shown in FIG. 19A, the portion corresponding to the first chip 10 including the first substrate 100 includes the four parallel arm resonators P1 to P4 of the first filter 1, and the portion corresponding to the second chip 20 including the second substrate 200 includes the four series arm resonators S1 to S4 of the first filter 1.

In Modified Examples 1 and 2 of the radio frequency module 500A, it is possible to reduce the size of the radio frequency module 500A.

Figure 20:
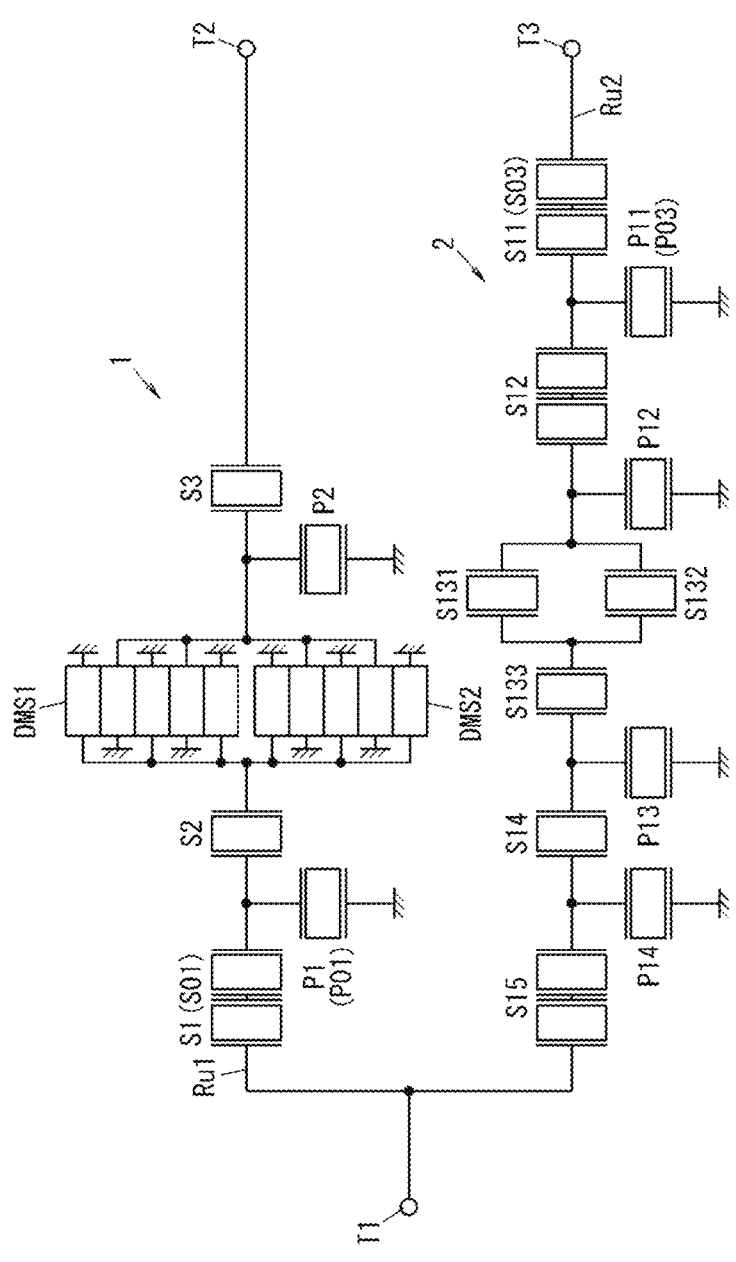
FIG. 20 is a circuit diagram of a first filter and a second filter in a radio frequency module according to Modified example 3 of Example Embodiment 2 of the present invention.
Figures 21A, 21B:
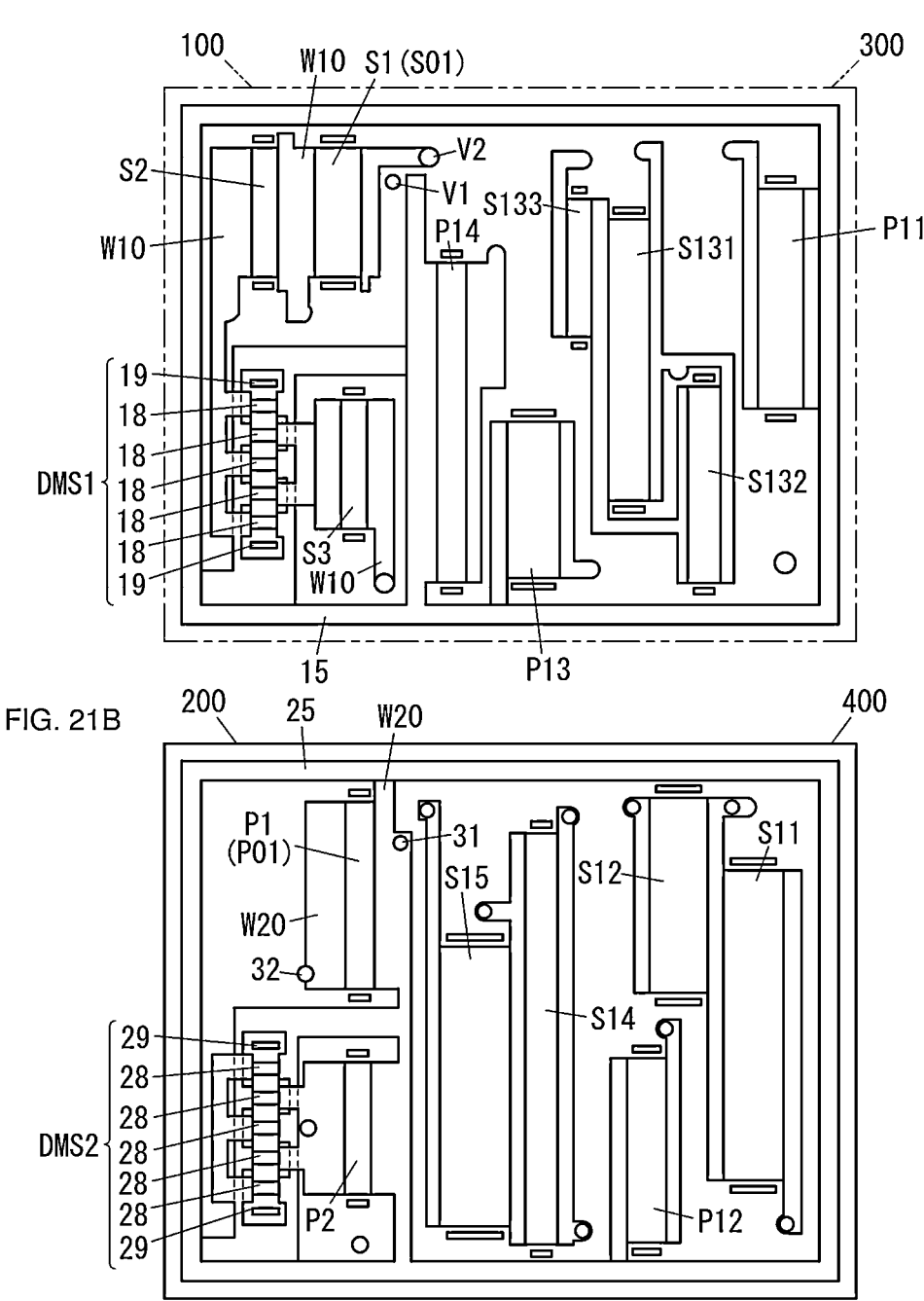
FIG. 21A is a transparent view of upper surfaces of a first chip and a third chip in the radio frequency module according to Modified example 3 of Example Embodiment 2 of the present invention as viewed from a lower surface side transparently.
FIG. 21B is a bottom surface view of a second chip and a fourth chip in the radio frequency module according to Modified example 3 of Example Embodiment 2 of the present invention.

Modified Example 3 of the radio frequency module 500A is different from Modified Example 1 of the radio frequency module 500A in Example Embodiment 2 in that, as shown in FIGS. 20, 21A, and 21B, the first filter 1 includes three series arm resonators S1, S2, and S3, two longitudinally coupled resonators DMS1 and DMS2, and two parallel arm resonators P1 and P2, similar to Modified Example 5 of Example Embodiment 1. In addition, in Modified Example 3 of the radio frequency module 500A, the portion corresponding to the first chip 10 including the first substrate 100 includes the three series arm resonators S1 to S3 and the one longitudinally coupled resonator DMS1 of the first filter 1, and the portion corresponding to the second chip 20 including the second substrate 200 includes the two parallel arm resonators P1 and P2 and the one longitudinally coupled resonator DMS2 of the first filter 1. In addition, in Modified Example 3 of the radio frequency module 500A, the portion corresponding to the third chip 30 including the third substrate 300 includes two series arm resonators S131 and 132 and three parallel arm resonators P11, P13, and P14 of the second filter 2, and the portion corresponding to the fourth chip 40 including the fourth substrate 400 includes four series arm resonators S11, S12, S14, and S15 and one parallel arm resonator P12 of the second filter 2.

Example Embodiment 3

A radio frequency module 500 according to Example Embodiment 3 of the present invention will be described below with reference to FIGS. 1, 22A, and 22B. Regarding the radio frequency module 500 according to Example Embodiment 3, the same or similar elements to those of the radio frequency module 500 according to Example Embodiment 1 are denoted by the same reference signs, and the description thereof will be omitted.

Figure 22A:
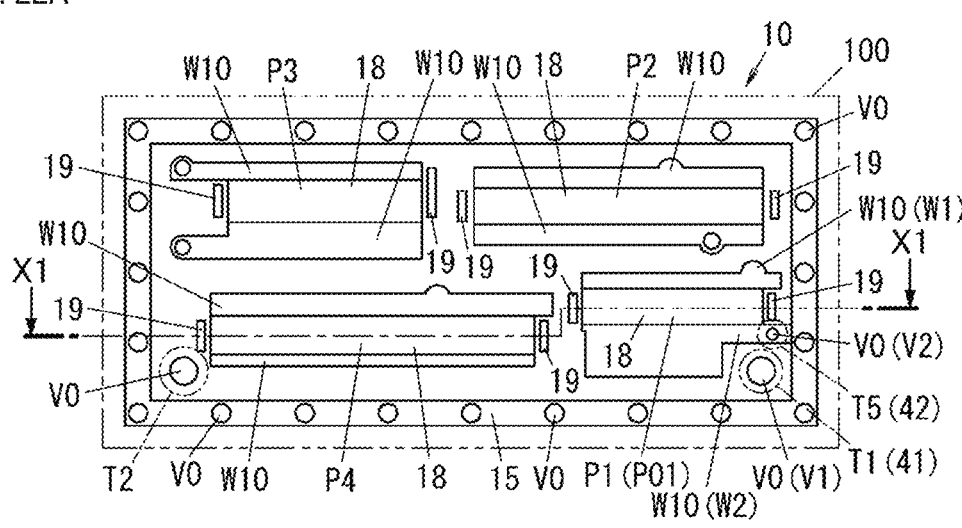
FIG. 22A is a transparent view of an upper surface of a first chip in a radio frequency module according to Example Embodiment 3 of the present invention as viewed from a lower surface side of the first chip transparently.
Figure 22B:
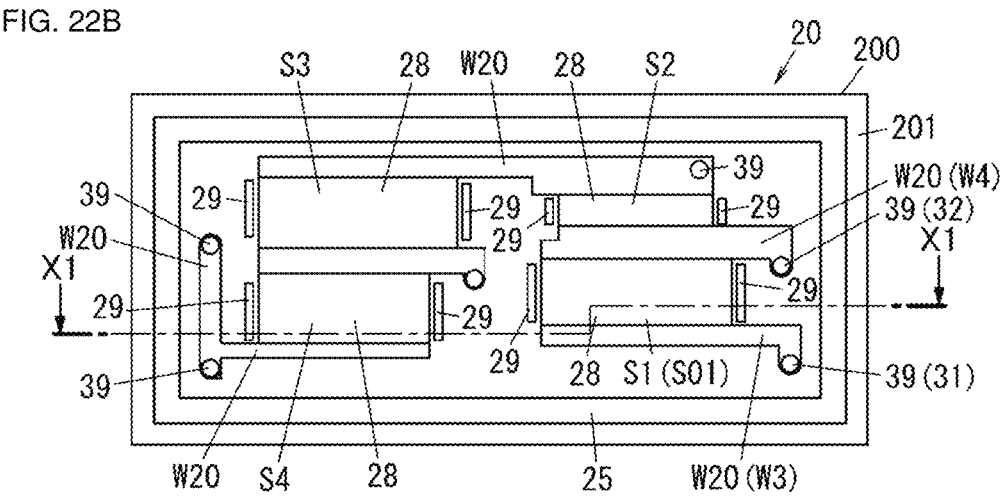
FIG. 22B is a bottom surface view of a second chip in the radio frequency module according to Example Embodiment 3 of the present invention.

In Example Embodiment 3, as shown in FIG. 22A, the first chip 10 further includes a first metal portion 15 disposed on the first main surface 101 of the first substrate 100 and a plurality of through-via conductors V0 that overlap the first metal portion 15 in plan view in the thickness direction D1 of the mounting board 9. The first metal portion 15 has a shape (here, a rectangular frame shape) along the outer edge of the first substrate 100 in plan view in the thickness direction D1 of the mounting board 9 (see FIG. 1).

In the radio frequency module 500, the plurality of through-via conductors V0 that overlap the first metal portion 15 penetrate the first substrate 100. The second through-via conductor V2 is connected to the ground terminal T5 and the first metal portion 15 connected to the ground.

With the radio frequency module 500 in Example Embodiment 3, since the first chip 10 includes the plurality of through-via conductors V0 connected to the first metal portion 15 connected to the ground, it is possible to reduce or prevent the fluctuation in the potential of the ground terminal T5. As a result, with the radio frequency module 500 according to Example Embodiment 3, it is possible to reduce or prevent the unnecessary inductive coupling between the current loop path Ro1 (see FIG. 2) including the first through-via conductor V1 and the second through-via conductor V2 and another current loop path, and it is possible to reduce or prevent the deterioration in the attenuation characteristics of the filter 1.

The configuration in which the first chip 10 includes the plurality of through-via conductors V0 overlapping the first metal portion 15, and the second through-via conductor V2 is connected to the ground terminal T5 and the first metal portion 15 connected to the ground is not limited to Example Embodiment 3 and may be used, for example, in the configuration of FIG. 18A, FIG. 19A, or FIG. 21A.

Other Modified Examples

Example Embodiments 1 to 3 and the like described above are merely one of various example embodiments of the present invention. Example Embodiments 1 and 2 and the like may be variously changed according to a design and the like as long as one or more of the advantageous effects of the present invention can be achieved, and different elements of different example embodiments may be combined or substituted as appropriate.

For example, in the radio frequency modules 500 and 500A, the first filter 1 may have a configuration in which Example Embodiment 1 and Modified Example 4 of Example Embodiment 1 are combined. In this configuration, the second chip 20 further includes the second series arm resonator (series arm resonator S4) that is spaced away from the first series arm resonator S01 that is the series arm resonator S01 (series arm resonator S1). In addition, in this configuration, the first chip 10 further includes the second parallel arm resonator (parallel arm resonator P3) that is spaced away from the first parallel arm resonator P01 that is the parallel arm resonator P01 (the parallel arm resonator P1). In addition, in this configuration, the second parallel arm resonator is connected to the second series arm resonator and the second ground conductor portion 906. In addition, in the configuration, in plan view in the thickness direction D1 of the mounting board 9, the second series arm resonator does not overlap the second parallel arm resonator. In addition, in the modified example having the configuration in which Example Embodiment 1 and Modified Example 4 of Example Embodiment 1 are combined, the first chip 10 may further include the second series arm resonator (series arm resonator S4) that is spaced away from the first series arm resonator S01 that is the series arm resonator S01 (series arm resonator S1), and the second chip 20 may further include the second parallel arm resonator (parallel arm resonator P3) that is spaced away from the first parallel arm resonator P01 that is the parallel arm resonator P01 (parallel arm resonator P1).

In addition, in the radio frequency modules 500 and 500A, the first filter 1 may have a pass band corresponding to the first communication band of the TDD scheme, the second filter 2 may have a pass band corresponding to the second communication band of the TDD scheme, and asynchronous communication can be performed in the first communication band and the second communication band. In this case, for example, the first communication band is Band39 of the 3GPP LTE standard, and the second communication band is Band41 of the 3GPP LTE standard.

In addition, each of the first filter 1 and the second filter 2 is not limited to the surface acoustic wave filter and may be, for example, a bulk acoustic wave filter. In the bulk acoustic wave filter, each of the plurality of acoustic wave resonators is a BAW resonator. The BAW resonator is, for example, a film bulk acoustic resonator (FBAR) or a solidly mounted resonator (SMR). In the case of a bulk acoustic wave filter, the first filter 1 includes, for example, a silicon substrate or a spinel substrate as each of the first substrate 100 and the second substrate 200. In addition, in the case of a bulk acoustic wave filter, the second filter 2 includes, for example, a silicon substrate or a spinel substrate as each of the third substrate 300 and the fourth substrate 400.

Further, the radio frequency modules 500 and 500A have a configuration in which a plurality of second electronic components are mounted on the first main surface 91 of the mounting board 9 not on the second main surface 92, and may have a configuration in which the second resin layer is not provided.

In addition, in a case where the first filter 1 includes only one series arm resonator, the series arm resonator S01 closest to the first input/output terminal T1 or the second input/output terminal T2 is one series arm resonator provided in the first filter 1. In addition, in a case where the first filter 1 includes only one parallel arm resonator, the parallel arm resonator P01 closest to the series arm resonator S01 is one parallel arm resonator provided in the first filter 1.

In addition, in a case where the second filter 2 includes only one series arm resonator, the third series arm resonator S03 closest to the first input/output terminal T1 or the third input/output terminal T3 is one series arm resonator provided in the second filter 2. In addition, in a case in which the second filter 2 includes only one parallel arm resonator, the third parallel arm resonator P03 closest to the third series arm resonator S03 is one parallel arm resonator provided in the second filter 2.

In addition, each of the first filter 1 and the second filter 2 is not limited to the ladder filter, and may be, for example, a T-type filter.

In addition, each of the first filter 1 and the second filter 2 may be, for example, an acoustic wave filter using a boundary acoustic wave, a plate wave, or the like.

In addition, the circuit configurations of the radio frequency modules 500 and 500A are not limited to the example of FIG. 7 described above. The radio frequency modules 500 and 500A may include, for example, a radio frequency front-end circuit that can be compatible with carrier aggregation and dual connectivity. In addition, the radio frequency modules 500 and 500A may include, for example, a radio frequency frontend circuit compatible with multi-input multi output (MIMO).

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio frequency module comprising:
a mounting board including a first conductor portion, a second conductor portion, and a ground conductor portion; and
a filter on the mounting board; wherein
the filter includes:
a first input/output terminal, a second input/output terminal, and a ground terminal connected to the first conductor portion, the second conductor portion, and the ground conductor portion, respectively;
a series arm resonator provided in a signal path between the first input/output terminal and the second input/output terminal and being closest to the first input/output terminal or the second input/output terminal; and
a parallel arm resonator connected between the signal path and the ground conductor portion and being closest to the series arm resonator;
in the filter:
a first chip including a first resonator defined by one of the series arm resonator and the parallel arm resonator is provided on the mounting board;
a second chip including a second resonator defined by a remaining one of the series arm resonator and the parallel arm resonator is provided on the first chip; and
the first resonator and the second resonator face each other in a thickness direction of the mounting board;
the filter includes a first connection conductor portion and a second connection conductor portion interposed between the first chip and the second chip in the thickness direction of the mounting board;
the first chip includes:
a first through-via conductor interposed between the first connection conductor portion and a first terminal defined by one of the ground terminal and an input/output terminal closest to the series arm resonator among the first input/output terminal and the second input/output terminal;
a second through-via conductor connected to a second terminal defined by a remaining one of the ground terminal and the input/output terminal closest to the series arm resonator among the first input/output terminal and the second input/output terminal;
a first wiring portion connecting the second connection conductor portion and the first resonator to each other; and
a second wiring portion connecting the first resonator and the second through-via conductor to each other;
the second chip includes:
a third wiring portion connecting the first connection conductor portion and the second resonator to each other; and
a fourth wiring portion connecting the second resonator and the second connection conductor portion to each other; and
a distance between the second through-via conductor and the first through-via conductor is shorter than a distance between the first wiring portion and the first through-via conductor.

2. The radio frequency module according to claim 1, wherein
the first chip includes:
a first substrate including a first main surface on an opposite side of a mounting board side and a second main surface on the mounting board side; and
a first functional electrode provided on the first main surface of the first substrate and defining a portion of the first resonator;
the first through-via conductor extends into the first substrate;
the first input/output terminal, the second input/output terminal, and the ground terminal are provided on a second main surface side of the first substrate;

the first wiring portion and the second wiring portion are provided on the first main surface of the first substrate;

the second chip includes:

a second substrate including a third main surface on a first chip side and a fourth main surface on an opposite side of the first chip side; and a second functional electrode provided on the third main surface of the second substrate and defining a portion of the second resonator;

the second through-via conductor extends into the second substrate; and the third wiring portion and the fourth wiring portion are provided on the third main surface of the second substrate.

3. The radio frequency module according to claim 2, wherein a distance between the first resonator and the first through-via conductor is shorter than the distance between the first wiring portion and the first through-via conductor.

4. The radio frequency module according to claim 2, wherein the mounting board further includes:

a second ground conductor portion different from a first ground conductor portion and defining the ground conductor portion;

one of the second chip and the first chip further includes a second series arm resonator provided in the signal path and spaced away from a first series arm resonator that is the series arm resonator;

a remaining one of the second chip and the first chip further includes a second parallel arm resonator connected to the second series arm resonator and the second ground conductor portion and spaced away from a first parallel arm resonator that is the parallel arm resonator; and in plan view in the thickness direction of the mounting board, the second series arm resonator does not overlap the second parallel arm resonator.

5. The radio frequency module according to claim 2, wherein the one of the second chip and the first chip includes a plurality of series arm resonators including the series arm resonator;

the remaining one of the second chip and the first chip includes a plurality of parallel arm resonators including the parallel arm resonator;

the plurality of parallel arm resonators and the plurality of series arm resonators correspond to each other on a one-to-one basis; and in plan view in the thickness direction of the mounting board, among the plurality of parallel arm resonators and the plurality of series arm resonators, the parallel arm resonator and the series arm resonator corresponding to each other overlap each other.

6. The radio frequency module according to claim 5, wherein at least one of the plurality of series arm resonators is a longitudinally coupled resonator.

7. The radio frequency module according to claim 2, further comprising:

a second filter provided on the mounting board and being different from a first filter defining the filter; wherein the mounting board further includes:

a third conductor portion; and a third ground conductor portion different from a first ground conductor portion defining the ground conductor portion, the second filter includes:

a third input/output terminal connected to the third conductor portion;

a third ground terminal different from a first ground terminal defining the ground terminal and being connected to the third ground conductor portion;

a third series arm resonator provided in a second signal path between the first input/output terminal and the third input/output terminal, the second signal path being different from a first signal path defining the signal path, and being closest to the first input/output terminal or the third input/output terminal; and a third parallel arm resonator connected to the second signal path and the third ground conductor portion and being closest to the third series arm resonator;

in the second filter:

a third chip including a third resonator defined by one of the third series arm resonator and the third parallel arm resonator is provided on the mounting board;

a fourth chip including a fourth resonator defined by a remaining one of the third series arm resonator and the third parallel arm resonator is provided on the third chip; and the third resonator and the fourth resonator face each other in the thickness direction of the mounting board;

the second filter includes a third connection conductor portion and a fourth connection conductor portion interposed between the third chip and the fourth chip in the thickness direction of the mounting board;

the third chip includes:

a third through-via conductor interposed between the third connection conductor portion and a third terminal defined by one of the third input/output terminal and the third ground terminal;

a fourth through-via conductor connected to a fourth terminal defined by a remaining one of the third input/output terminal and the third ground terminal;

a fifth wiring portion connecting the fourth connection conductor portion and the third resonator to each other; and a sixth wiring portion connecting the third resonator and the fourth through-via conductor to each other;

the fourth chip includes:

a seventh wiring portion connecting the third connection conductor portion and the fourth resonator to each other; and an eighth wiring portion connecting the fourth resonator and the fourth connection conductor portion to each other; and a distance between the fourth through-via conductor and the third through-via conductor is shorter than a distance between the fifth wiring portion and the third through-via conductor.

8. The radio frequency module according to claim 7, wherein the third chip includes:

a third substrate including a fifth main surface on an opposite side of the mounting board side and a sixth main surface on the mounting board side; and a third functional electrode provided on the fifth main surface of the third substrate and defining a portion of the third resonator;

the third through-via conductor extends into the third substrate;

the fifth wiring portion and the sixth wiring portion are provided on the fifth main surface of the third substrate;

the fourth chip includes:

a fourth substrate including a seventh main surface on a third chip side and an eighth main surface on an opposite side of the third chip side; and a fourth functional electrode provided on the seventh main surface of the fourth substrate and defining a portion of the fourth resonator;

the fourth through-via conductor extends into the fourth substrate; and the seventh wiring portion and the eighth wiring portion are provided on the seventh main surface of the fourth substrate.

9. The radio frequency module according to claim 8, wherein a distance between the fourth through-via conductor and the third through-via conductor is shorter than a distance between the third resonator and the third through-via conductor.

10. The radio frequency module according to claim 8, wherein the first substrate includes a first piezoelectric substrate;

the second substrate includes a second piezoelectric substrate;

the third substrate includes a third piezoelectric substrate; and the fourth substrate includes a fourth piezoelectric substrate.

11. The radio frequency module according to claim 10, wherein the first substrate and the third substrate are common to each other; and the second substrate and the fourth substrate are common to each other.

12. The radio frequency module according to claim 8, wherein the first filter includes a pass band corresponding to a first communication band of a TDD scheme;

the second filter includes a pass band corresponding to a second communication band of the TDD scheme; and asynchronous communication is enabled in the first communication band and the second communication band.

13. The radio frequency module according to claim 12, wherein the first communication band is Band39 of a 3GPP LTE standard; and the second communication band is Band41 of the 3GPP LTE standard.

14. The radio frequency module according to claim 2, wherein the first chip further includes:

a first metal portion provided on the first main surface of the first substrate and including a portion extending along an outer edge of the first substrate in plan view in the thickness direction of the mounting board; and a plurality of through-via conductors extending into the first substrate and overlapping the first metal portion in plan view in the thickness direction of the mounting board;

the second chip further includes: a second metal portion provided on the third main surface of the second substrate and bonded to the first metal portion;

in plan view in the thickness direction of the mounting board, the first metal portion overlaps the second metal portion;

the second terminal overlapping the second through-via conductor is the ground terminal; and the second through-via conductor is connected to the ground terminal and the first metal portion connected to a ground.

15. A radio frequency module comprising:

a mounting board including a first conductor portion, a second conductor portion, and a ground conductor portion; and a filter on the mounting board; wherein the filter includes:

a first input/output terminal, a second input/output terminal, and a ground terminal, connected to the first conductor portion, the second conductor portion, and the ground conductor portion, respectively;

a series arm resonator provided in a signal path between the first input/output terminal and the second input/output terminal and being closest to the first input/output terminal or the second input/output terminal; and a parallel arm resonator connected between the signal path and the ground conductor portion and being closest to the series arm resonator;

in the filter:

a first chip including a first resonator defined by one of the series arm resonator and the parallel arm resonator is provided on the mounting board;

a second chip including a second resonator defined by a remaining one of the series arm resonator and the parallel arm resonator is provided on the first chip; and the first resonator and the second resonator face each other in a thickness direction of the mounting board;

the filter includes a first connection conductor portion and a second connection conductor portion interposed between the first chip and the second chip in the thickness direction of the mounting board;

the first chip includes:

a first through-via conductor interposed between the first connection conductor portion and a first terminal defined by one of the ground terminal and an input/output terminal closest to the series arm resonator among the first input/output terminal and the second input/output terminal;

a second through-via conductor connected to a second terminal defined by a remaining one of the ground terminal and the input/output terminal closest to the series arm resonator among the first input/output terminal and the second input/output terminal;

a first wiring portion connecting the second connection conductor portion and the first resonator to each other; and a second wiring portion connecting the first resonator and the second through-via conductor to each other;

the second chip includes:

a third wiring portion connecting the first connection conductor portion and the second resonator to each other; and a fourth wiring portion connecting the second resonator and the second connection conductor portion to each other; and in plan view in the thickness direction of the mounting board, a direction of a radio frequency signal passing through the first resonator is opposite to a direction of a radio frequency signal passing through the second resonator.

16. A communication device comprising:

the radio frequency module according to claim 1; and a signal processing circuit connected to the radio frequency module.

17. A filter provided on a mounting board, the filter comprising:

a first input/output terminal, a second input/output terminal, and a ground terminal connected to a first conductor portion, a second conductor portion, and a ground conductor portion provided in the mounting board, respectively;

a series arm resonator provided in a signal path between the first input/output terminal and the second input/output terminal and being closest to the first input/output terminal or the second input/output terminal; and a parallel arm resonator connected between the signal path and the ground conductor portion and being closest to the series arm resonator; wherein in the filter, a first chip and a second chip are stacked;

the first chip includes a first resonator defined by one of the series arm resonator and the parallel arm resonator;

the second chip includes a second resonator defined by a remaining one of the series arm resonator and the parallel arm resonator;

the first resonator and the second resonator face each other in a thickness direction of the first chip;

the filter further includes:

a first connection conductor portion and a second connection conductor portion interposed between the first chip and the second chip in the thickness direction of the first chip;

the first chip includes:

a first through-via conductor interposed between the first connection conductor portion and a first terminal defined by one of the ground terminal and an input/output terminal closest to the series arm resonator among the first input/output terminal and the second input/output terminal;

a second through-via conductor connected to a second terminal defined by a remaining one of the ground terminal and the input/output terminal closest to the series arm resonator among the first input/output terminal and the second input/output terminal;

a first wiring portion connecting the second connection conductor portion and the first resonator to each other; and a second wiring portion connecting the first resonator and the second through-via conductor to each other;

the second chip includes:

a third wiring portion connecting the first connection conductor portion and the second resonator to each other; and a fourth wiring portion connecting the second resonator and the second connection conductor portion to each other; and a distance between the second through-via conductor and the first through-via conductor is shorter than a distance between the first wiring portion and the first through-via conductor.

18. The filter according to claim 17, wherein the first chip includes:

a first substrate including a first main surface on a second chip side and a second main surface on an opposite side of the second chip side; and a first functional electrode provided on the first main surface of the first substrate and defining a portion of the first resonator;

the first through-via conductor extends into the first substrate;

the first input/output terminal, the second input/output terminal, and the ground terminal are provided on a second main surface side of the first substrate;

the first wiring portion and the second wiring portion are provided on the first main surface of the first substrate;

the second chip includes:

a second substrate including a third main surface on a first chip side and a fourth main surface on an opposite side of the first chip side; and a second functional electrode provided on the third main surface of the second substrate and defining a portion of the second resonator;

the second through-via conductor extends into the second substrate; and the third wiring portion and the fourth wiring portion are provided on the third main surface of the second substrate.

19. The filter according to claim 18, wherein the first chip further includes:

a first metal portion provided on the first main surface of the first substrate and including a portion extending along an outer edge of the first substrate in plan view in the thickness direction of the first chip; and a plurality of through-via conductors extending into the first substrate and overlapping the first metal portion in plan view in the thickness direction of the first chip;

the second chip further includes a second metal portion provided on the third main surface of the second substrate and bonded to the first metal portion;

in plan view in the thickness direction of the first chip, the first metal portion overlaps the second metal portion;

the second terminal overlapping the second through-via conductor defines the ground terminal; and the second through-via conductor is connected to the ground terminal and the first metal portion connected to a ground.

20. The filter according to claim 17, wherein the second through-via conductor overlaps the second terminal in the thickness direction of the first chip.

* * * * *